(12) United States Patent (10) Patent No.: US 9,112,172 B2
Kaiser et al. (45) Date of Patent: Aug. 18, 2015

(54) ORGANIC ELECTROLUMINESCENCE DEVICE

(75) Inventors: Joachim Kaiser, Darmstadt (DE); Holger Heil, Frankfurt am Main (DE); Simone Leu, Dittelsheim-Hessloch (DE); Horst Vestweber, Gilserberg (DE)

(73) Assignee: Merck Patent GmbH (DE)

( * ) Notice: Subject to any disclaimer, the term of this patent is extended or adjusted under 35 U.S.C. 154(b) by 910 days.

(21) Appl. No.: 13/263,626

(22) PCT Filed: Mar. 10, 2010

(86) PCT No.: PCT/EP2010/001488
§ 371 (c)(1),
(2), (4) Date: Oct. 7, 2011

(87) PCT Pub. No.: WO2010/115498
PCT Pub. Date: Oct. 14, 2010

(65) Prior Publication Data
US 2012/0037896 A1 Feb. 16, 2012

(30) Foreign Application Priority Data
Apr. 9, 2009 (DE) .......................... 10 2009 017 064

(51) Int. Cl.
*H01L 51/50* (2006.01)
*C09B 57/00* (2006.01)
*H01L 51/00* (2006.01)

(52) U.S. Cl.
CPC ............ *H01L 51/5016* (2013.01); *C09B 57/00* (2013.01); *C09B 57/008* (2013.01); *H01L 51/5036* (2013.01); *H01L 51/006* (2013.01); *H01L 51/0058* (2013.01); *H01L 51/0085* (2013.01)

(58) Field of Classification Search
None
See application file for complete search history.

(56) References Cited

U.S. PATENT DOCUMENTS

| 2002/0027416 | A1  | 3/2002  | Kim et al. |
| 2003/0137239 | A1* | 7/2003  | Matsuura et al. ............. 313/503 |
| 2005/0206305 | A1  | 9/2005  | Masuda et al. |
| 2006/0125380 | A1  | 6/2006  | Nagara et al. |
| 2006/0158104 | A1* | 7/2006  | Iijima et al. ................... 313/504 |
| 2007/0024168 | A1  | 2/2007  | Nishimura et al. |
| 2007/0241676 | A1* | 10/2007 | Park et al. ..................... 313/506 |
| 2009/0091250 | A1  | 4/2009  | Yasukawa et al. |

FOREIGN PATENT DOCUMENTS

| CN | 1905205 A | 1/2007 |
| CN | 101404323 A | 4/2009 |
| JP | 2001313180 A | 11/2001 |
| JP | 2005267990 A | 9/2005 |
| JP | 2006172762 A | 6/2006 |
| JP | 2006172763 A | 6/2006 |
| JP | 2006/324233 A | 11/2006 |
| JP | 2007287691 A | 11/2007 |
| JP | 2011527797 A | 11/2011 |
| WO | WO-2007/127063 A2 | 11/2007 |

OTHER PUBLICATIONS

Schwartz, G., et al., "Highly efficient white organic light emitting diodes comprising an interlayer to separate fluorescent and phosphorescent regions," *Applied Physics Letters*, vol. 89, pp. 083509-1 through 083509-3 (2006).
Seo, J.H., et al., "Hybrid spacer for high-efficiency white organic light-emitting diodes," *Applied Physics Letters*, vol. 92, pp. 183303-1 through 183303-3 (2008).
Japanese Office Action for application No. 2012-503883, mailing date Dec. 3, 2013.
Chinese Office Action issued Oct. 8, 2014 for Chinese Patent Application No. 2010-80015454.6.

* cited by examiner

*Primary Examiner* — Gregory Clark
(74) *Attorney, Agent, or Firm* — Drinker Biddle & Reath LLP

(57) ABSTRACT

The present invention relates to white-emitting organic electroluminescent devices which have at least one blue-fluorescent emitter layer and at least one phosphorescent emitter layer.

19 Claims, 1 Drawing Sheet

Structure of the electroluminescent device according to the invention
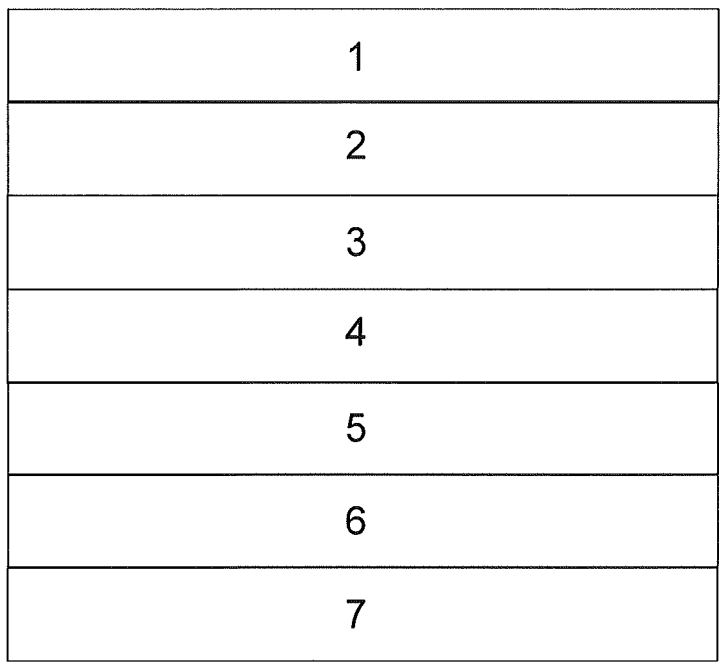

ORGANIC ELECTROLUMINESCENCE DEVICE

RELATED APPLICATIONS

This application is a national stage application (under 35 U.S.C. §371) of PCT/EP2010/001488, filed Mar. 10, 2010, which claims benefit of German Application No. 10 2009 017 064.2, filed Apr. 9, 2009.

The present invention relates to white-emitting organic electroluminescent devices which comprise at least one layer having at least one phosphorescent dopant and at least one layer having at least one fluorescent dopant.

The structure of organic electroluminescent devices (OLEDs) in which organic semiconductors are employed as functional materials is described, for example, in U.S. Pat. Nos. 4,539,507, 5,151,629, EP 0676461 and WO 98/27136. A development in the area of organic electroluminescent devices is white-emitting OLEDs. These can be employed either for white monochrome displays or with coloured filters for full-colour displays. Furthermore, they are suitable for lighting applications. White-emitting organic electroluminescent devices based on low-molecular-weight compounds generally have at least two emission layers. They frequently have at least three emission layers, which exhibit blue, green and orange or red emission. Either fluorescent or phosphorescent emitters are used in the emission layers, where the phosphorescent emitters exhibit significant advantages owing to the higher achievable efficiency. The general structure of a white-emitting OLED of this type having at least one phosphorescent layer is described, for example, in WO 05/011013. Owing to the higher achievable efficiency, a white-emitting OLED which comprises only phosphorescent emitter layers would be desirable. However, since blue-phosphorescent emitters currently generally do not meet the standard requirements, in particular with respect to the operating lifetime, hybrid OLEDs, i.e. a fluorescent blue emitter layer combined with phosphorescent orange or red and green emitter layers (in the case of three-colour white) or a fluorescent blue emitter layer combined with a phosphorescent yellow to orange emitter layer (in the case of two-colour white), are used in most applications in accordance with the prior art.

A fundamental problem of hybrid OLEDs of this type consists in that standard matrix and emitter materials which are used in the blue-fluorescent emitter layer have an excessively low triplet level for phosphorescent green and generally also for phosphorescent red, which may result in red or green triplet excitons being extinguished via the blue emitter layer. This results in low efficiency of the OLED. In order to obtain maximum efficiency from a white hybrid OLED, care must be taken to prevent this extinction of triplet excitons. One possibility in accordance with the prior art consists in preventing direct contact between the fluorescent blue emitter layer and the phosphorescent orange, red or green emitter layer by the introduction of a non-luminous interlayer. This interlayer usually consists of a mixture of two materials, where one material tends to have hole-conducting properties and the other tends to have electron-conducting properties.

Appl. Phys. Lett. 2006, 89, 083509 discloses an OLED having three-colour white, where the interlayer between the blue-fluorescent emitter layer and the green-phosphorescent emitter layer consists of TCTA as hole-conducting compound and TPBI as electron-conducting compound. There is still a clear need for improvement here in respect of the efficiency. The lifetime is not quoted.

Appl. Phys. Lett. 2008, 93, 073302 discloses an OLED having three-colour white, where the red and green emitters are combined in one layer. The interlayer between the blue-fluorescent emitter layer and the red- and green-phosphorescent emitter layer consists of TCTA and TPBI. There is still a clear need for improvement here in respect of the efficiency. It is furthermore evident that it is difficult to set the correct colour since only a device having acceptable warm white would be obtained. The lifetime is not quoted.

Appl. Phys. Lett. 2006, 89, 023503 discloses a white-emitting OLED, where the interlayer between the blue-fluorescent emitter layer and the green-phosphorescent emitter layer consists of CBP. However, no colour coordinates are achieved on the white curve here, possibly since CBP is not sufficiently hole-conducting and consequently sufficient blue components are not present in the spectrum.

Appl. Phys. Lett. 2008, 92, 183303 discloses a white-emitting OLED which comprises, in this sequence, a blue-emitting layer, a red-emitting layer, a green-emitting layer and another blue-emitting layer, with an interlayer at each interface. The interlayer here consists of CBP or of CBP:MADN or of CBP:BPhen. In the case of the use of CBP, there is still a clear need for improvement in respect of the efficiency. In the case of the use of CBP:MADN, there is still a clear need for improvement in respect of the colour. In the case of the use of CBP:BPhen, there is still a need for improvement in respect of the efficiency and the colour. The lifetime is not disclosed.

US 2007/0194703 discloses an undoped interlayer between the fluorescent emitter layer and the phosphorescent emitter layer.

WO 2006/130883 discloses an interlayer between the fluorescent emitter layer and the phosphorescent emitter layer in a white-emitting OLED, where the same material is preferably used in the interlayer and in the two adjacent emitter layers.

EP 1670082 discloses an interlayer between the fluorescent emitter layer and the phosphorescent emitter layer in a white-emitting OLED, where the interlayer preferably comprises a hole-transport material and an electron-transport material.

EP 1670083 discloses a bipolar interlayer between the fluorescent emitter layer and the phosphorescent emitter layer in a white-emitting OLED, where the interlayer preferably comprises a hole-transport material and an electron-transport material.

US 2006/0216544 discloses a white-emitting OLED which has an interlayer at each boundary between the emitting layers, where the interlayer in each case consists of only one material.

In the prior art described above, there is still a need for improvement, in particular in respect of the efficiency, the emission colour and the lifetime, even on use of interlayers between the emitting layers of a white-emitting OLED.

High requirements are made of the materials of the interlayer here, meaning that it is difficult to achieve OLEDs having interlayers which at the same time have the desired colour location, high efficiency and a long lifetime. In particular, the following requirements are made of the interlayer:

1.) The interlayer must not significantly influence the charge balance. It must be capable of transporting holes and electrons to an adequate and balanced extent, so that the emitter layers on both sides of the interlayer are supplied with both types of charge carrier in the correct amount. Only in this way can a white colour location be achieved. This greatly restricts the suitable materials with respect to HOMO and LUMO energies.

2.) The materials of the interlayer must have an adequately high triplet level in order not themselves to extinguish triplet excitons. For an interlayer between green and blue, this means that standard hole-conductor materials, such as, for example, NPB, cannot be used since they have an excessively low triplet level.

3.) The interlayer must not significantly reduce the operating lifetime of the OLED. This is, in particular, a problem for the hole-conducting component of the interlayer since standard hole-conducting materials having an adequately high triplet level, such as, for example, TCTA, have an inadequate operating lifetime, in particular if they are directly adjacent to the blue emitter layer.

There is thus overall a need for improvement either with respect to suitable materials which meet the above-mentioned criteria, or with respect to the device architecture. The technical problem on which the present invention is based is therefore to provide a device architecture for a hybrid OLED which enables a desired white colour location to be set and at the same time high efficiency to be combined with a long operating lifetime.

Surprisingly, it has been found that a device structure in which at least two non-emitting interlayers are inserted between the phosphorescent emitter layer and the fluorescent emitter layer achieves very good efficiency and significantly improves the operating lifetime compared with an OLED which comprises only one interlayer, without materials other than those already used anyway in the OLED being necessary in the second interlayer. In this case, no special requirement with respect to the triplet level again has to be made of the interlayer lying closer to the fluorescent emitter layer, meaning that a much greater variety of possible materials is available here, enabling materials to be found more easily which ensure a balanced charge balance and which do not have an inadequate operating lifetime when they are in direct contact with the blue layer.

The invention thus relates to an organic electroluminescent device comprising at least one blue-fluorescent emitter layer and at least one further emitter layer which is a phosphorescent emitter layer, characterised in that at least two interlayers 1 and 2 are inserted between the blue-fluorescent emitter layer and the next phosphorescent emitter layer, where interlayer 1 is adjacent to the phosphorescent emitter layer and interlayer 2 is adjacent to the blue-fluorescent emitter layer.

The two interlayers introduced between the fluorescent emitter layer and the phosphorescent emitter layer are non-luminous layers, i.e. these layers exhibit no emission during operation of the OLED.

A preferred embodiment of the invention relates to a white-emitting organic electroluminescent device. This is characterised in that it emits light having CIE colour coordinates in the range from 0.28/0.29 to 0.45/0.41.

The organic electroluminescent device according to the invention comprises, as described above, an anode, a cathode and at least two emitting layers, which are arranged between the anode and the cathode. The organic electroluminescent device does not necessarily have to comprise only layers built up from organic or organometallic materials. Thus, it is also possible for the anode, cathode and/or one or more layers to comprise inorganic materials or to be built up entirely from inorganic materials.

If the organic electroluminescent device has precisely two emitting layers, the second emitter layer is preferably a yellow- or orange-phosphorescent emitter layer. The yellow- or orange-phosphorescent layer here can be arranged on the anode side and the blue-fluorescent layer can be arranged on the cathode side. Likewise, the yellow- or orange-phosphorescent layer can be arranged on the cathode side and the blue-fluorescent layer can be arranged on the anode side.

In a preferred embodiment of the invention, the electroluminescent device according to the invention has at least three emitting layers.

If the organic electroluminescent device has three emitting layers, one of these layers is preferably a red- or orange-phosphorescent emitter layer and one of the layers is a green-phosphorescent emitter layer. In a preferred embodiment of the invention, the red- or orange-phosphorescent layer is on the anode side, the blue-fluorescent layer is on the cathode side and the green-phosphorescent layer is between the red-phosphorescent layer and the blue-fluorescent layer. In a further preferred embodiment of the invention, the red- or orange-phosphorescent layer is on the cathode side, the blue-fluorescent layer is on the anode side and the green-phosphorescent layer is between the red-phosphorescent layer and the blue-fluorescent layer.

It is also possible for the organic electroluminescent device to have more than three emitter layers.

A yellow-emitting layer here is taken to mean a layer whose photoluminescence maximum is in the range from 540 to 570 nm. An orange-emitting layer is taken to mean a layer whose photoluminescence maximum is in the range from 570 to 600 nm. A red-emitting layer here is taken to mean a layer whose photoluminescence maximum is in the range from 600 to 750 nm. A green-emitting layer is taken to mean a layer whose photoluminescence maximum is in the range from 490 to 540 nm. A blue-emitting layer is taken to mean a layer whose photoluminescence maximum is in the range from 440 to 490 nm. The photoluminescence maximum here is determined by measurement of the photoluminescence spectrum of the layer having a layer thickness of 50 nm.

In a preferred embodiment of the invention, the blue-fluorescent emitter layer is on the cathode side. The organic electroluminescent device according to the invention particularly preferably has the following structure: anode/orange- or red-phosphorescent emitter layer/green-phosphorescent emitter layer/interlayer 1/interlayer 2/blue-fluorescent emitter layer/cathode.

This general device structure is depicted diagrammatically in FIG. 1. Layer 1 here stands for the anode, layer 2 for the red-phosphorescent emitter layer, layer 3 for the green-phosphorescent emitter layer, layer 4 for interlayer 1, layer 5 for interlayer 2, layer 6 for the blue-fluorescent emitter layer and layer 7 for the cathode.

For the purposes of this invention, a phosphorescent compound, as present in the phosphorescent emitter layers of the organic device according to the invention, is a compound which exhibits, at room temperature, luminescence from an excited state of relatively high spin multiplicity, i.e. a spin state>1, in particular from an excited triplet state. For the purposes of this invention, all luminescent transition-metal complexes, in particular all luminescent iridium, platinum and copper compounds, are to be regarded as phosphorescent compounds.

For the purposes of this invention, a fluorescent compound, as present in the blue-fluorescent emitter layer, is a compound which exhibits, at room temperature, luminescence from an excited singlet state. For the purposes of this invention, all luminescent compounds built up only from the elements C, H, N, O, S, F, B and P are, in particular, to be regarded as fluorescent compounds.

Interlayer 1, which is adjacent to the phosphorescent emitter layer, is described in greater detail below:

In a preferred embodiment of the invention, interlayer 1, which is adjacent to the phosphorescent emitter layer, comprises a mixture of an electron-conducting material and a hole-conducting material. Both the hole-conducting material and the electron-conducting material here are preferably materials whose triplet energy is greater than the triplet energy of the emitter of the adjacent phosphorescent emitter layer. The triplet energy of the hole-conducting and electron-conducting materials of interlayer 1 is preferably greater than 2.4 eV, particularly preferably greater than 2.6 eV.

The triplet energy $E(T_1)$ of a molecule is defined as the energy difference between the energy of the ground state $E(G)$ of a molecule and the energy of the lowest triplet state $E(T)$ of this molecule, both energies in eV. This quantity can be determined experimentally or calculated via quantum-chemical methods. For experimental determination, use can be made of the optical transition from the lowest triplet state into the ground state. This transition is also referred to as phosphorescence, which typically has an emitting lifetime in the range from µs to s. In contrast to fluorescence (optical transition from the lowest singlet state), phosphorescence is usually quite weak since this transition is spin-forbidden. In the case of molecules, such as, for example, tris(phenylpyridyl)iridium, in which the transition is less forbidden, the phosphorescence can be measured with the aid of a simple photoluminescence spectrometer. The corresponding triplet energy is obtained from the emission edge (the greatest energy) of the phosphorescence spectrum. Suitable samples for this purpose are dilute solutions (about $10^{-5}$ mol $l^{-1}$) or thin films (about 50 nm thick) of the corresponding molecule. The crucial factor for the concentration or thickness is the absorbance of the sample at the excitation wavelength. It should be about 0.1. In the case of molecules whose phosphorescence cannot be observed so simply, it is possible on the one hand to increase the phosphorescence by suppressing interfering competing processes, such as, for example, extinction on oxygen or thermal deactivation. In order to exclude oxygen, it is advisable to degas the solution by means of the so-called pump-and-freeze technique. In order to suppress thermal deactivation of the phosphorescence, it is advisable to cool the sample in a cryostat with the aid of liquid nitrogen or helium. This increases the intensity of the phosphorescence. If the sample used is a solution, it is advisable to use a solvent or solvent mixture which forms a glass at low temperatures, such as, for example, 2-methyl-THF. The sensitivity of the apparatus compared with a simple photoluminescence spectrometer can be increased by using a (pulsed) laser for the excitation to the absorption maximum and carrying out the detection using a spectrometer which enables time-delayed detection in order to exclude, for example, on a time basis intense fluorescence which likewise occurs.

If the triplet energy cannot be determined experimentally by the above-mentioned method, an alternative consists in determining the triplet energy with the aid of a quantum-chemical calculation, for example by means of time-dependent density functional theory (TD-DFT). This is carried out via the commercially available Gaussian 03W software (Gaussian Inc.) using method B3PW91/6-31G(d). For the calculation of transition-metal complexes, it is advisable to use the LANL2DZ base set.

The hole-conducting material used in interlayer 1 preferably has an HOMO (highest occupied molecular orbital) of >−5.4 eV, particularly preferably >−5.2 eV.

The electron-conducting material used in interlayer 1 preferably has an LUMO (lowest unoccupied molecular orbital) of <−2.4 eV, particularly preferably <−2.6 eV.

The mixing ratio of the hole-conducting compound and the electron-conducting compound in interlayer 1 is preferably between 95:5 and 30:70, particularly preferably between 90:10 and 50:50, in each case based on the volume.

The layer thickness of interlayer 1 is preferably between 1 and 10 nm, particularly preferably between 2 and 7 nm.

In a preferred embodiment of the invention, the electron-conducting material of interlayer 1 is an aromatic ketone.

For the purposes of this application, an aromatic ketone is taken to mean a carbonyl group to which two aromatic or heteroaromatic groups or aromatic or heteroaromatic ring systems are bonded directly.

In a preferred embodiment of the invention, the aromatic ketone is a compound of the following formula (1):

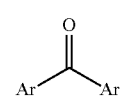

formula (1)

where the following applies to the symbols used:

Ar is on each occurrence, identically or differently, an aromatic or heteroaromatic ring system having 5 to 60 aromatic ring atoms, which may in each case be substituted by one or more groups $R^1$;

$R^1$ is on each occurrence, identically or differently, H, D, F, Cl, Br, I, CHO, C(=O)Ar$^1$, P(=O)(Ar$^1$)$_2$, S(=O)Ar$^1$, S(=O)$_2$Ar$^1$, CR$^2$=CR$^2$Ar$^1$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which may be substituted by one or more radicals R$^2$, where one or more non-adjacent CH$_2$ groups may be replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms may be replaced by D, F, Cl, Br, I, CN or NO$_2$, or an aromatic or heteroaromatic ring system having 5 to 60 aromatic ring atoms, which may in each case be substituted by one or more radicals R$^2$, or an aryloxy or heteroaryloxy group having 5 to 60 aromatic ring atoms, which may be substituted by one or more radicals R$^2$, or a combination of these systems; two or more adjacent substituents R$^1$ here may also form a mono- or polycyclic, aliphatic or aromatic ring system with one another;

Ar$^1$ is on each occurrence, identically or differently, an aromatic or heteroaromatic ring system having 5 to 40 aromatic ring atoms, which may be substituted by one or more radicals R$^2$;

R$^2$ is on each occurrence, identically or differently, H, D, CN or an aliphatic, aromatic and/or heteroaromatic hydrocarbon radical having 1 to 20 C atoms, in which, in addition, H atoms may be replaced by D or F; two or more adjacent substituents R$^2$ here may also form a mono- or polycyclic, aliphatic or aromatic ring system with one another.

For the purposes of this invention, an aryl group contains at least 6 C atoms; for the purposes of this invention, a heteroaryl group contains at least 2 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed aryl or heteroaryl group, for example naphthalene, anthracene, pyrene, quinoline, isoquinoline, etc.

For the purposes of this invention, an aromatic ring system contains at least 6 C atoms in the ring system. For the purposes of this invention, a heteroaromatic ring system contains at least 2 C atoms and at least one heteroatom in the ring system, with the proviso that the sum of C atoms and heteroatoms is at least 5. The heteroatoms are preferably selected from N, O and/or S. For the purposes of this invention, an aromatic or heteroaromatic ring system is intended to be taken to mean a system which does not necessarily contain only aryl or heteroaryl groups, but instead in which, in addition, a plurality of aryl or heteroaryl groups may be interrupted by a short non-aromatic unit (preferably less than 10% of the atoms other than H), such as, for example, an $sp^3$-hybridised C, N or O atom or a carbonyl group. Thus, for example, systems such as 9,9'-spirobifluorene, 9,9-diarylfluorene, triarylamine, diaryl ether, stilbene, benzophenone, etc., are also intended to be taken to be aromatic ring systems for the purposes of this invention. An aromatic or heteroaromatic ring system is likewise taken to mean systems in which a plurality of aryl or heteroaryl groups are linked to one another by single bonds, for example biphenyl, terphenyl or bipyridine.

For the purposes of the present invention, a $C_1$- to $C_{40}$-alkyl group, in which, in addition, individual H atoms or $CH_2$ groups may be substituted by the above-mentioned groups, is particularly preferably taken to mean the radicals methyl, ethyl, n-propyl, i-propyl, n-butyl, i-butyl, s-butyl, t-butyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 2-methyl-pentyl, n-heptyl, 2-heptyl, 3-heptyl, 4-heptyl, cycloheptyl, 1-methylcyclo-hexyl, n-octyl, 2-ethylhexyl, cyclooctyl, 1-bicyclo[2.2.2]octyl, 2-bicyclo-[2.2.2]octyl, 2-(2,6-dimethyl)octyl, 3-(3,7-dimethyl)octyl, trifluoromethyl, pentafluoroethyl and 2,2,2-trifluoroethyl. A $C_2$- to $C_{40}$-alkenyl group is preferably taken to mean ethenyl, propenyl, butenyl, pentenyl, cyclopentenyl, hexenyl, cyclohexenyl, heptenyl, cycloheptenyl, octenyl or cyclooctenyl. A $C_2$- to $C_{40}$-alkynyl group is preferably taken to mean ethynyl, propynyl, butynyl, pentynyl, hexynyl, heptynyl or octynyl. A $C_1$- to $C_{40}$-alkoxy group is particularly preferably taken to mean methoxy, trifluoromethoxy, ethoxy, n-propoxy, i-propoxy, n-butoxy, i-butoxy, s-butoxy, t-butoxy or 2-methyl-butoxy. An aromatic or heteroaromatic ring system having 5-60 aromatic ring atoms, which may also in each case be substituted by the above-mentioned radicals R and which may be linked to the aromatic or heteroaromatic ring system via any desired positions, is taken to mean, in particular, groups derived from benzene, naphthalene, anthracene, phenanthrene, benzanthracene, pyrene, chrysene, perylene, fluoranthene, benzofluoranthene, naphthacene, pentacene, benzopyrene, biphenyl, bi-phenylene, terphenyl, terphenylene, fluorene, benzofluorene, dibenzo-fluorene, spirobifluorene, dihydrophenanthrene, dihydropyrene, tetrahydropyrene, cis- or trans-indenofluorene, cis- or trans-monobenzoindeno-fluorene, cis- or trans-dibenzoindenofluorene, truxene, isotruxene, spiro-truxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

Suitable compounds of the formula (1) are, in particular, the ketones disclosed in WO 04/093207 and the unpublished DE 102008033943.1. These are incorporated into the present invention by way of reference.

It is evident from the definition of the compounds of the formula (1) that they do not have to contain just one carbonyl group, but instead may also contain a plurality of these groups.

The group Ar in compounds of the formula (1) is preferably an aromatic ring system having 6 to 40 aromatic ring atoms, i.e. it does not contain any heteroaryl groups. As defined above, the aromatic ring system does not necessarily have to contain only aromatic groups, but instead two aryl groups may also be interrupted by a non-aromatic group, for example by a further carbonyl group.

In a further preferred embodiment of the invention, the group Ar contains not more than two condensed rings. It is thus preferably built up only from phenyl and/or naphthyl groups, particularly preferably only from phenyl groups, but does not contain any larger condensed aromatic groups, such as, for example, anthracene.

Preferred groups Ar which are bonded to the carbonyl group are phenyl, 2-, 3- or 4-tolyl, 3- or 4-o-xylyl, 2- or 4-m-xylyl, 2-p-xylyl, o-, m- or p-tert-butylphenyl, o-, m- or p-fluorophenyl, benzophenone, 1-, 2- or 3-phenyl-methanone, 2-, 3- or 4-biphenyl, 2-, 3- or 4-o-terphenyl, 2-, 3- or 4-m-ter-phenyl, 2-, 3- or 4-p-terphenyl, 2'-p-terphenyl, 2'-, 4'- or 5'-m-terphenyl, 3'-or 4'-o-terphenyl, p-, m,p-, o,p-, m,m-, o,m- or o,o-quaterphenyl, quinque-phenyl, sexiphenyl, 1-, 2-, 3- or 4-fluorenyl, 2-, 3- or 4-spiro-9,9'-bifluorenyl, 1-, 2-, 3- or 4-(9,10-dihydro)phenanthrenyl, 1- or 2-naphthyl, 2-, 3-, 4-, 5-, 6-, 7- or 8-quinolinyl, 1-, 3-, 4-, 5-, 6-, 7- or 8-isoquinolinyl, 1- or 2-(4-methylnaphthyl), 1- or 2-(4-phenylnaphthyl), 1- or 2-(4-naphthylnaphthyl), 1-, 2- or 3-(4-naphthylphenyl), 2-, 3- or 4-pyridyl, 2-, 4- or 5-pyrimidinyl, 2-or 3-pyrazinyl, 3- or 4-pyridazinyl, 2-(1,3,5-triazin)yl, 2-, 3- or 4-(phenylpyridyl), 3-, 4-, 5- or 6-(2,2'-bipyridyl), 2-, 4-, 5- or 6-(3,3'-bipyridyl), 2- or 3-(4,4'-bipyridyl), and combinations of one or more of these radicals.

The groups Ar may be substituted by one or more radicals $R^1$. These radicals $R^1$ are preferably selected, identically or differently on each occurrence, from the group consisting of H, D, F, $C(=O)Ar^1$, $P(=O)(Ar^1)_2$, $S(=O)Ar^1$, $S(=O)_2Ar^1$, a straight-chain alkyl group having 1 to 4 C atoms or a branched or cyclic alkyl group having 3 to 5 C atoms, each of which may be substituted by one or more radicals R², where one or more H atoms may be replaced by D or F, or an aromatic ring system having 6 to 24 aromatic ring atoms, which may be substituted by one or more radicals R², or a combination of these systems; two or more adjacent substituents here may also form a mono- or polycyclic, aliphatic or aromatic ring system with one another. If the organic electroluminescent device is applied from solution, straight-chain, branched or cyclic alkyl groups having up to 10 C atoms are also preferred as substituents R¹. The radicals R¹ are particularly preferably selected, identically or differently on each occurrence, from the group consisting of H, C(=O) Ar¹ or an aromatic ring system having 6 to 24 aromatic ring atoms, which may be substituted by one or more radicals R², but is preferably unsubstituted.

In a further preferred embodiment of the invention, the group Ar¹ is, identically or differently on each occurrence, an aromatic ring system having 6 to 24 aromatic ring atoms, which may be substituted by one or more radicals R². Ar¹ is particularly preferably, identically or differently on each occurrence, an aromatic ring system having 6 to 12 aromatic ring atoms.

Particular preference is given to benzophenone derivatives which are substituted in each of the 3,5,3',5'-positions by an aromatic or heteroaromatic ring system having 5 to 30 aromatic ring atoms, which may in turn be substituted by one or more radicals R¹ as defined above. Preference is furthermore given to ketones which are substituted by at least one spirobifluorene group.

Preferred aromatic ketones are therefore the compounds of the following formulae (2) to (5):

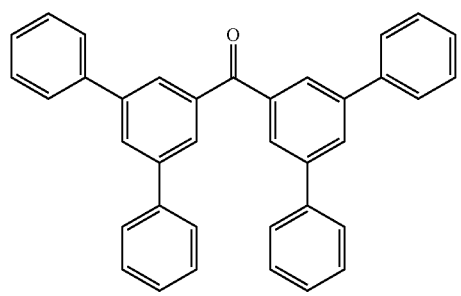

formula (2)

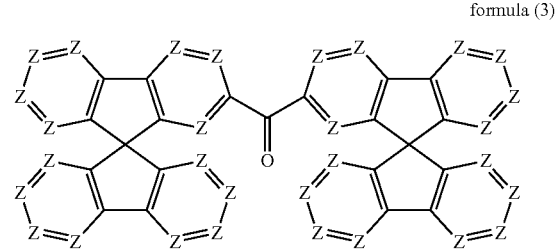

formula (3)

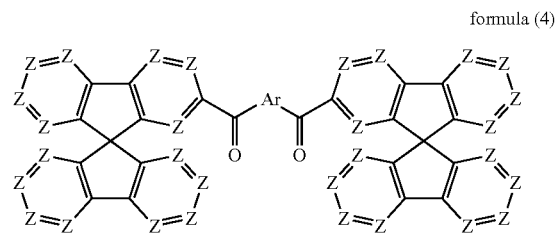

formula (4)

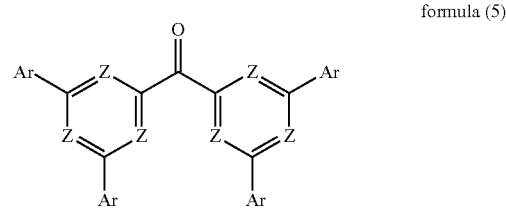

formula (5)

where Ar and R¹ have the same meaning as described above for formula (1), and furthermore:

Z is, identically or differently on each occurrence, CR¹ or N;

n is, identically or differently on each occurrence, 0 or 1.

Ar in the formulae (2), (4) and (5) preferably stands for an aromatic or heteroaromatic ring system having 5 to 30 aromatic ring atoms, which contains no condensed aryl groups having more than 10 aromatic ring atoms, preferably no condensed aryl groups at all, and which may be substituted by one or more radicals R¹. The groups Ar mentioned above are particularly preferred.

Examples of suitable compounds of the formulae (1) to (5) which can be employed as electron-conducting material in interlayer 1 are compounds (1) to (59) depicted below.

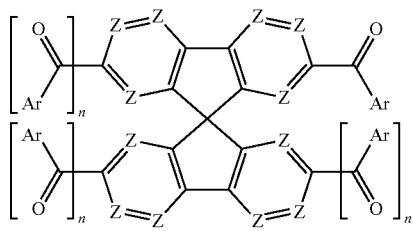

(1)

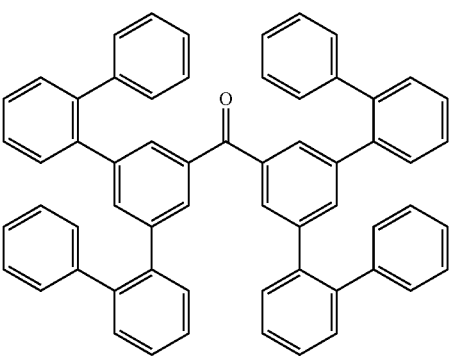

(2)

-continued
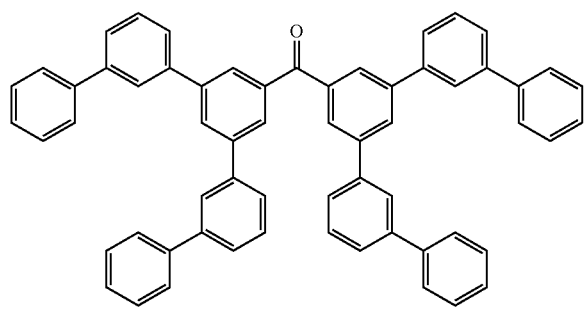
(3)
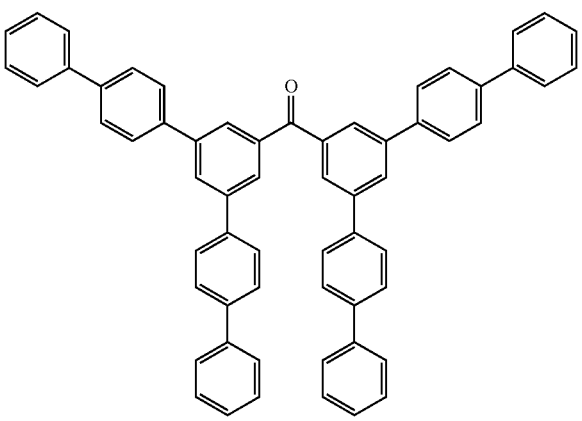
(4)
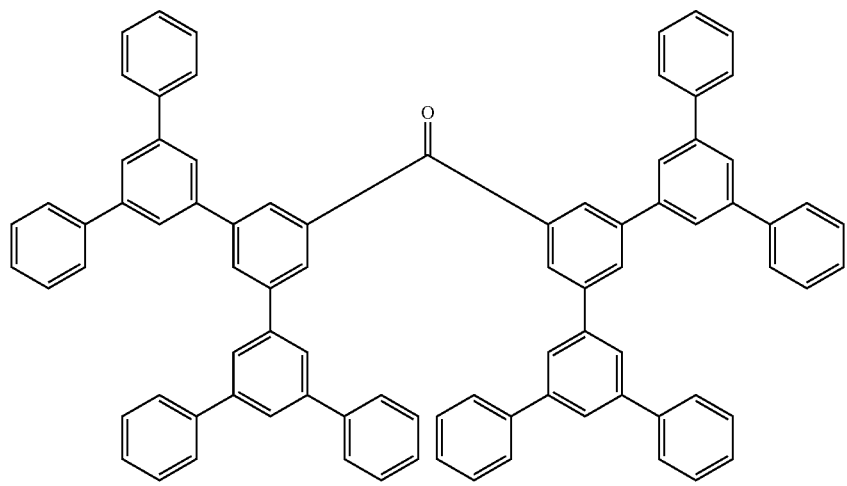
(5)
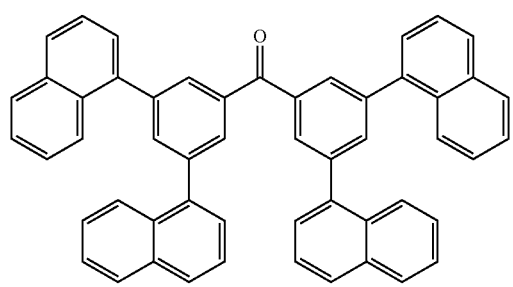
(6)
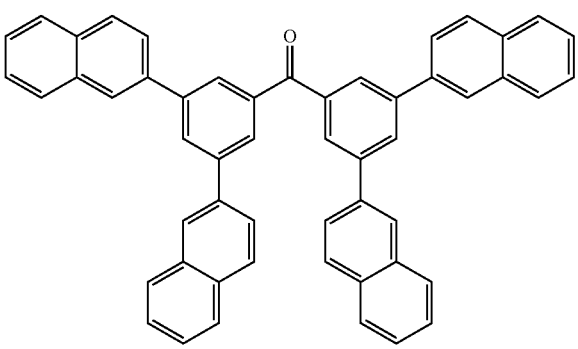
(7)

-continued
(8)
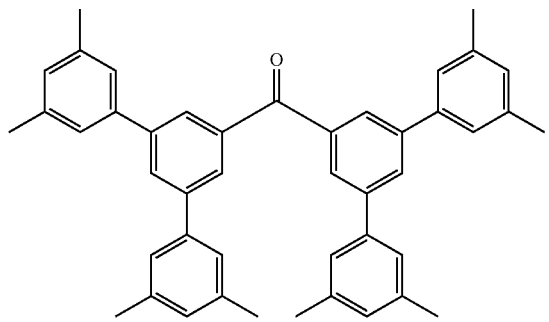
(9)
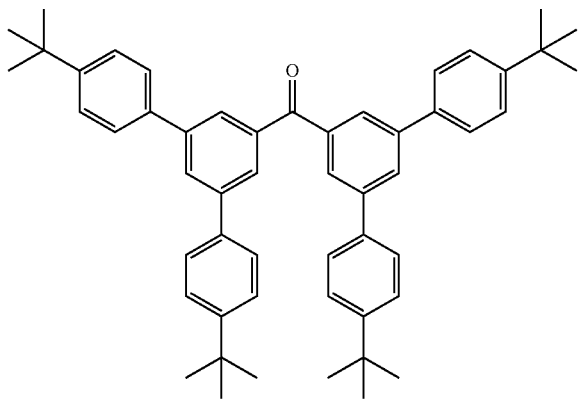
(10)
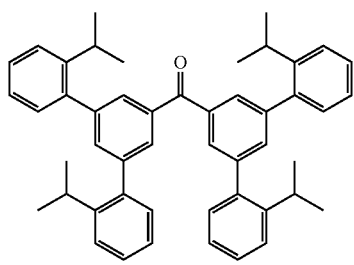
(11)
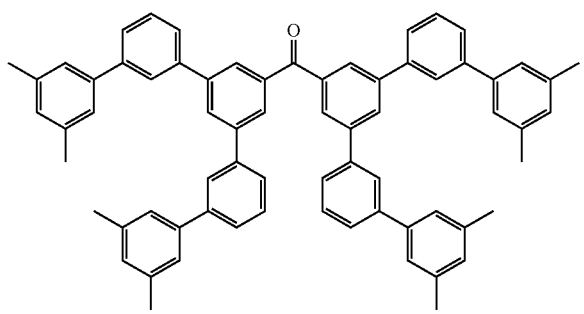
(12)
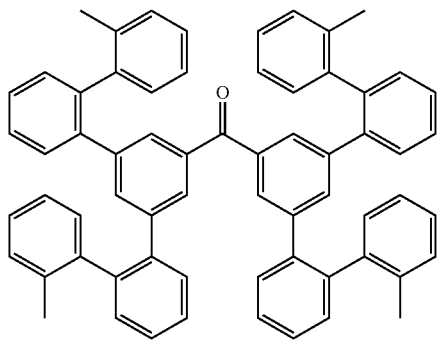
(13)
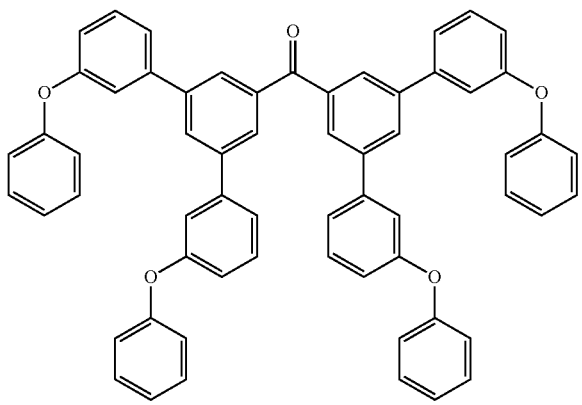
(14)
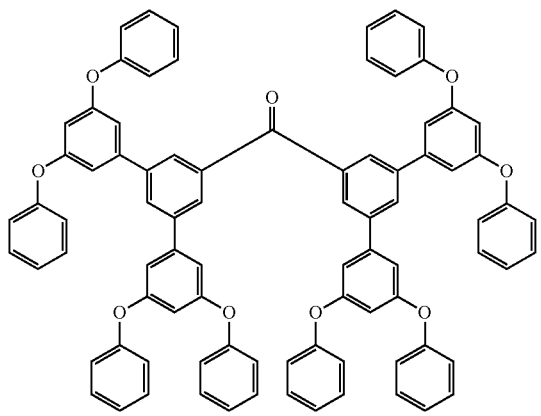
(15)
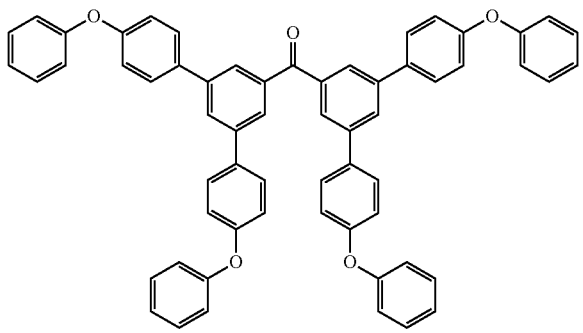

-continued
(16)
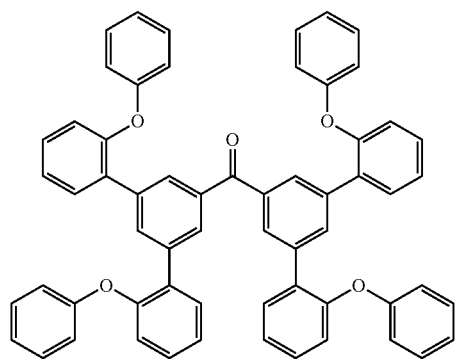
(17)
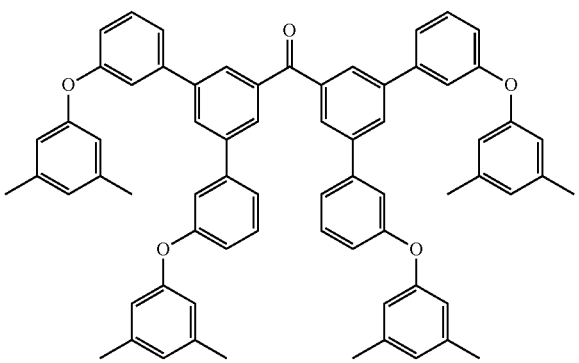
(18)
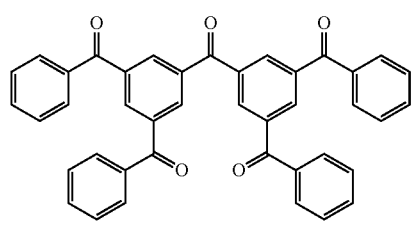
(19)
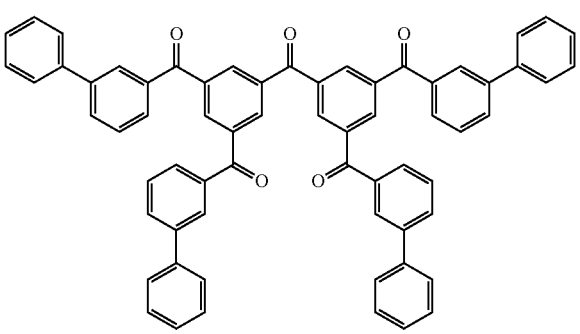
(20)
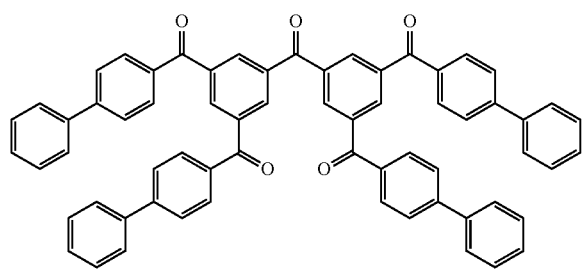
(21)
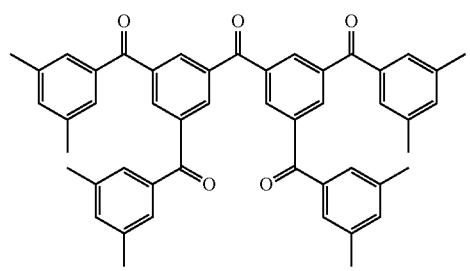
(22)
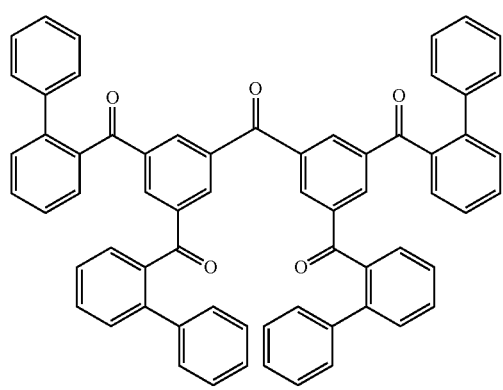
(23)
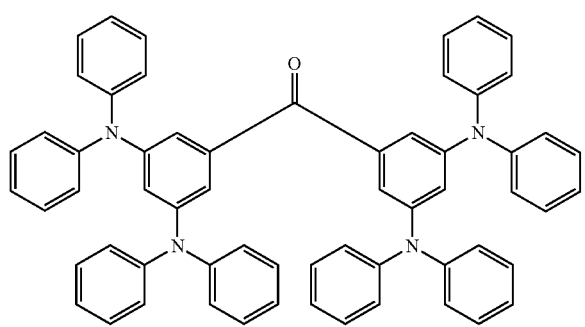

-continued
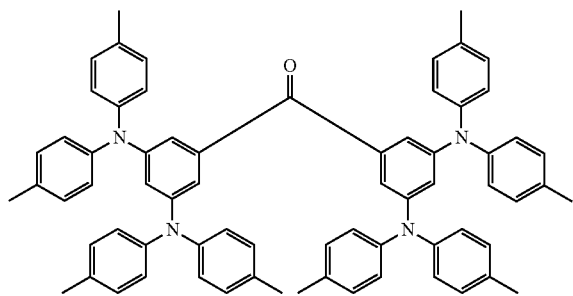
(24)
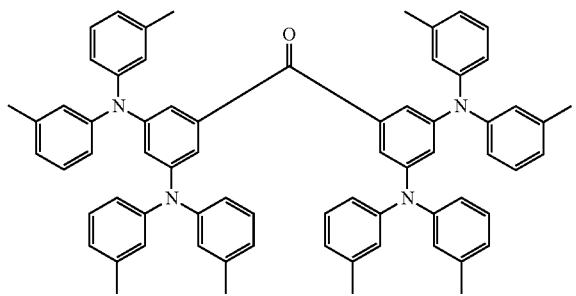
(25)
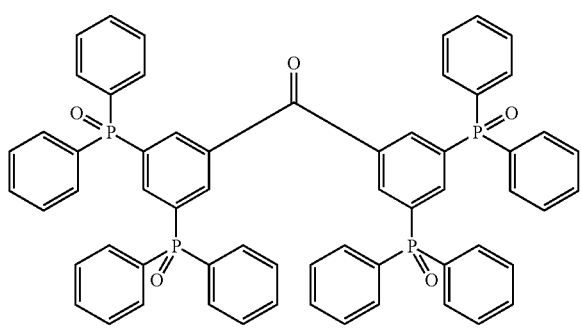
(26)
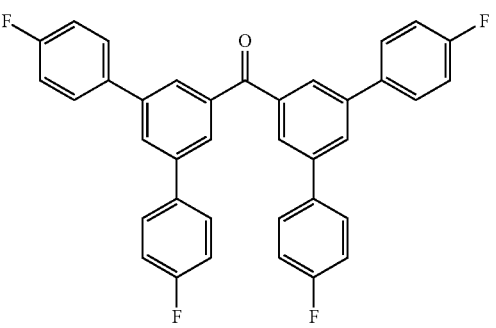
(27)
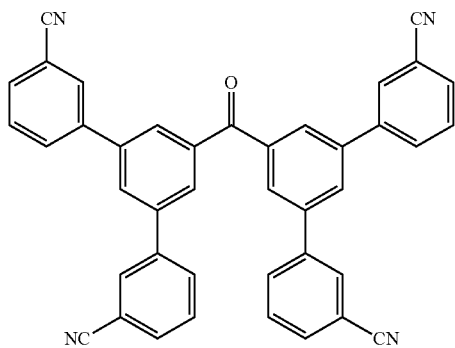
(28)
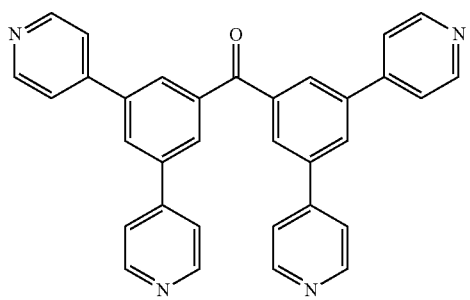
(29)
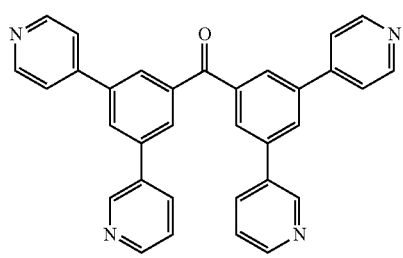
(30)
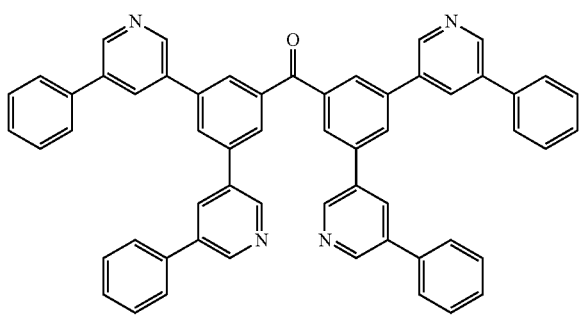
(31)

-continued
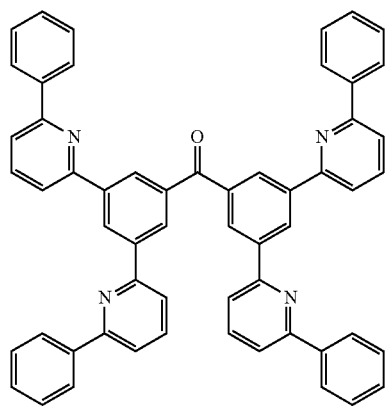
(32)
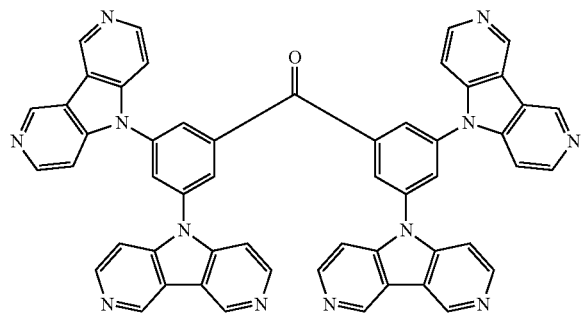
(33)
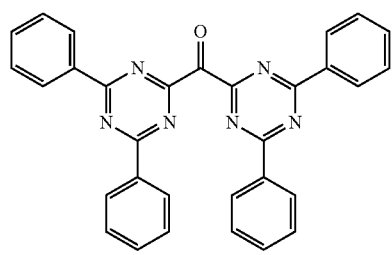
(36)
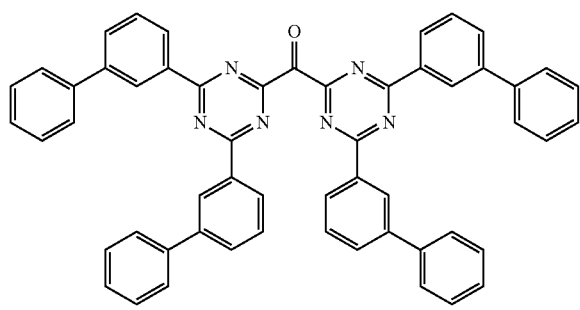
(37)
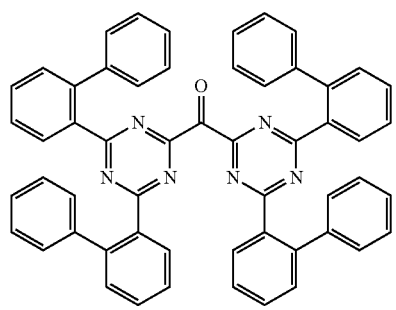
(38)
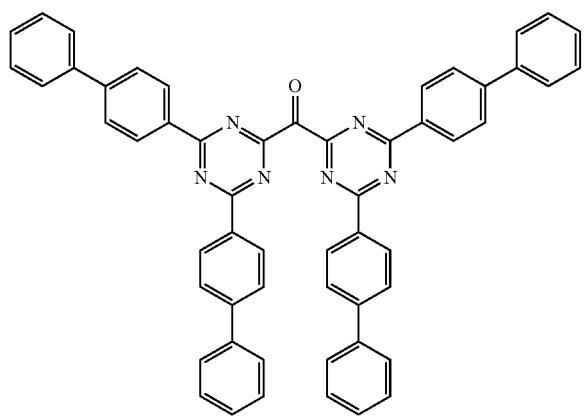
(39)

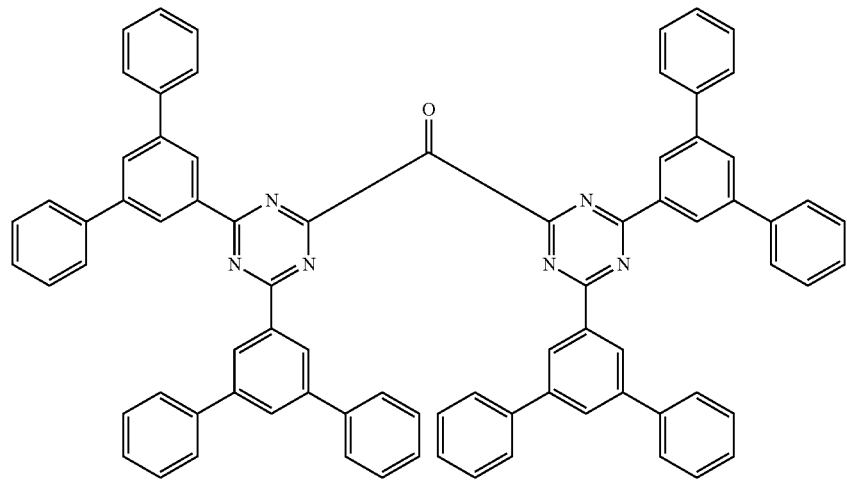
(40)
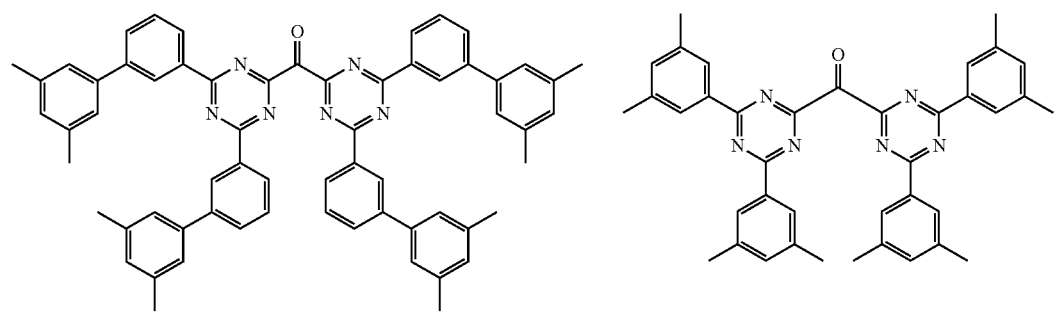
(41) (42)
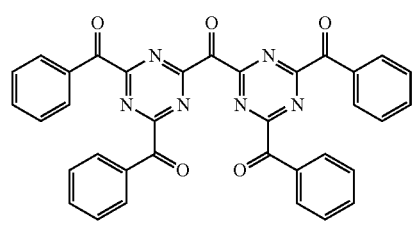
(43)
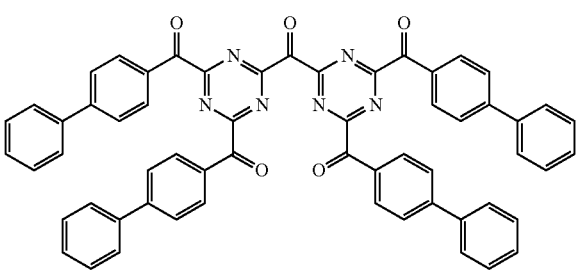
(44)
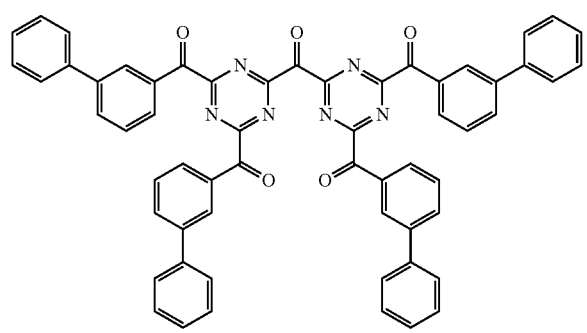
(45)
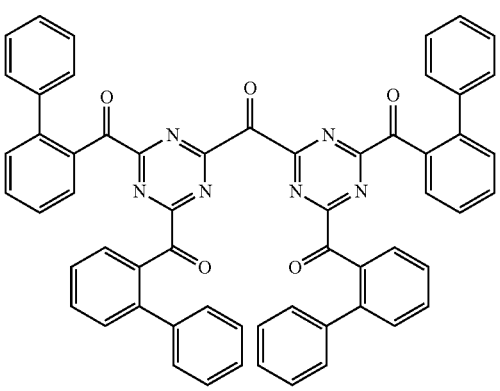
(46)

(47)
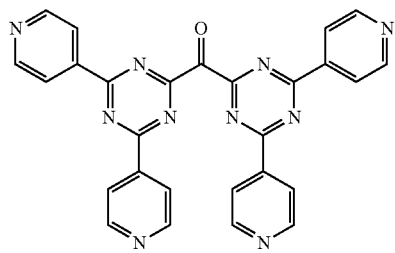
(48)
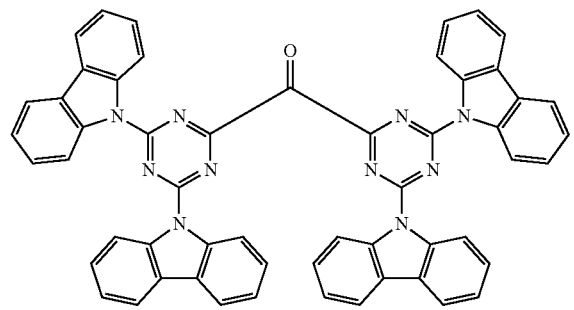
-continued
(49)
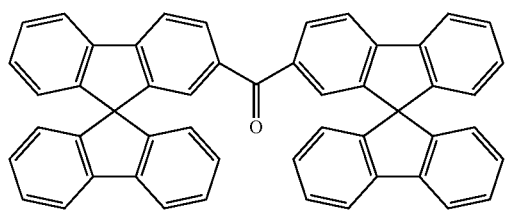
(50)
(51)
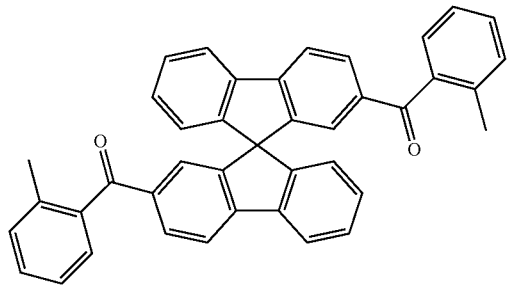
(52)
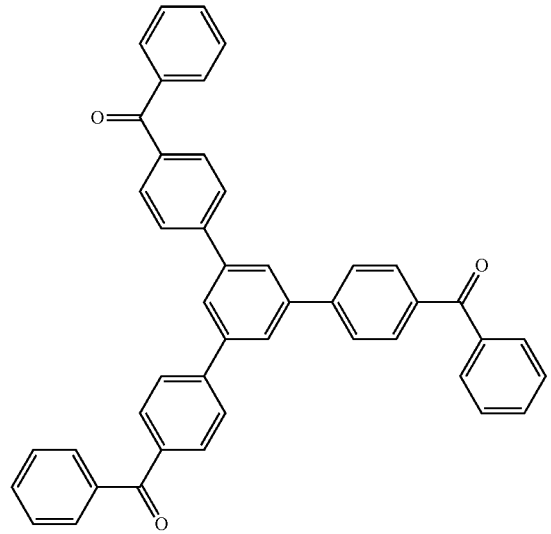
(53)
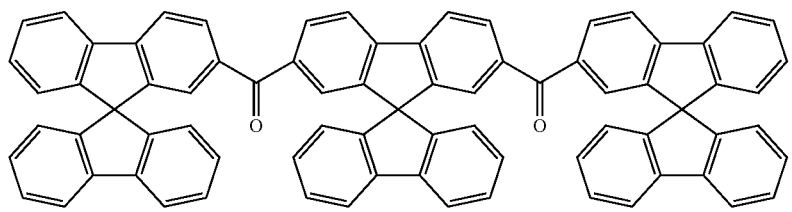
(54)
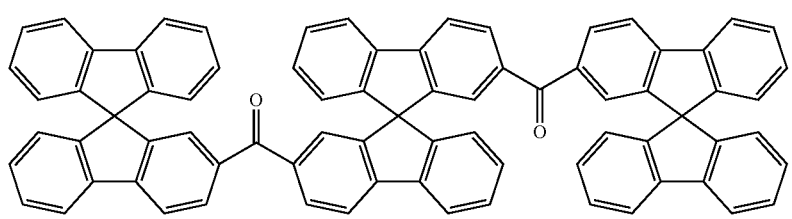

-continued
(55) 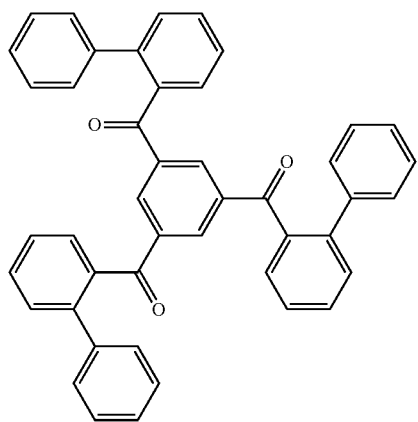
(56) 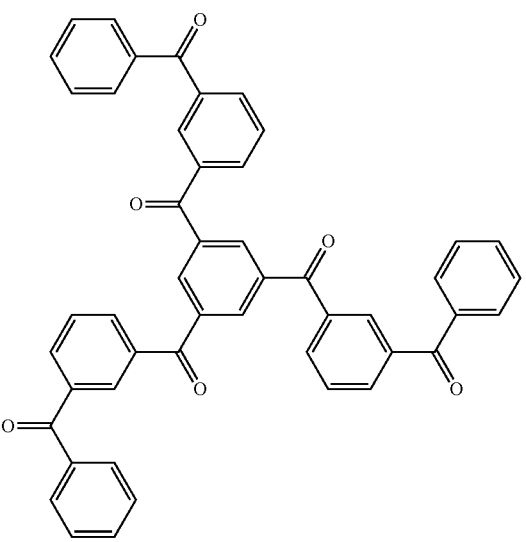
(57) 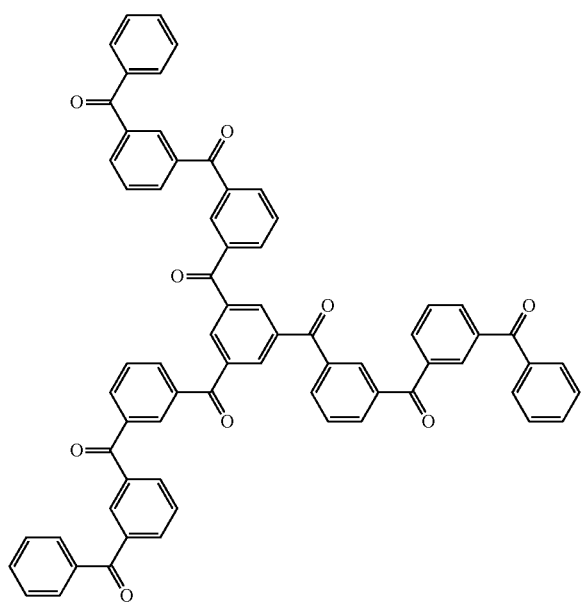
(58) 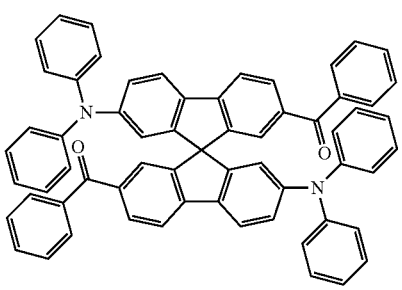
(59) 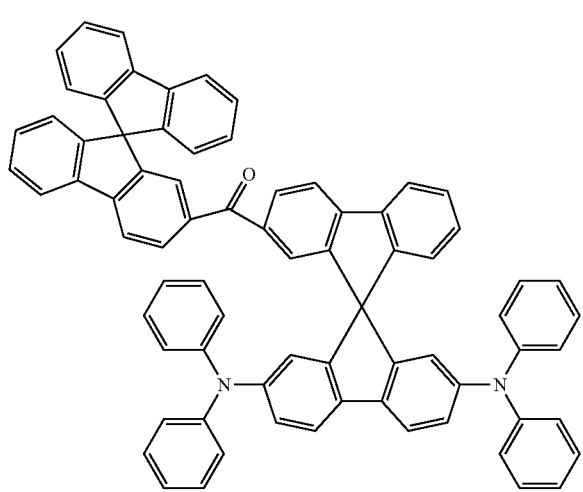

In a further preferred embodiment of the invention, the electron-conducting material is a triazine derivative which is substituted by at least one aromatic or heteroaromatic group, preferably at least two aromatic or heteroaromatic groups, particularly preferably three aromatic or heteroaromatic groups. Suitable triazine derivatives which can be used as electron-transporting material are thus compounds of the following formula (6) or (7):

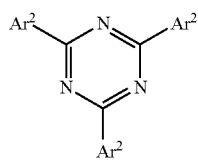

formula (6)

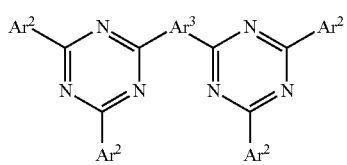

formula (7)

where $R^1$ has the meaning mentioned above, and the following applies to the other symbols used:

$Ar^2$ is, identically or differently on each occurrence, a monovalent aromatic or heteroaromatic ring system having 5 to 60 aromatic ring atoms, which may in each case be substituted by one or more radicals $R^1$;

$Ar^3$ is a divalent aromatic or heteroaromatic ring system having 5 to 60 aromatic ring atoms, which may be substituted by one or more radicals $R^1$.

In compounds of the formulae (6) and (7), it is preferred for at least one group $Ar^2$ to be selected from the groups of the following formulae (8) to (14) and for the other groups $Ar^2$ to have the meaning indicated above.

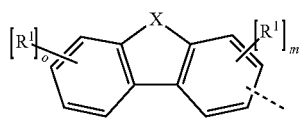

formula (8)

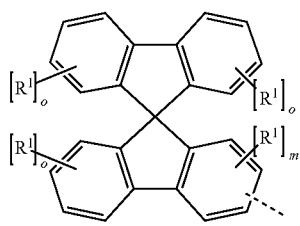

formula (9)

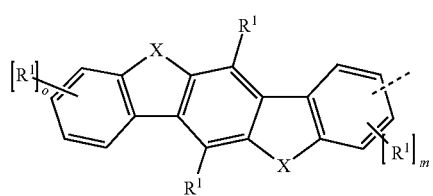

formula (10)

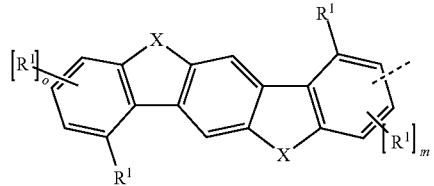

formula (11)

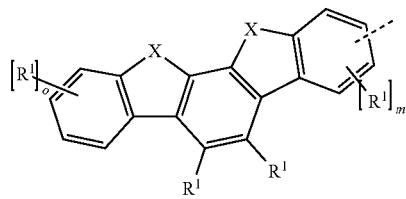

formula (12)

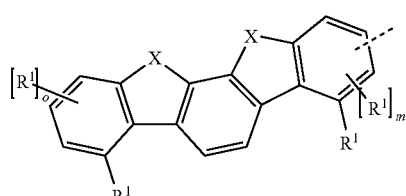

formula (13)

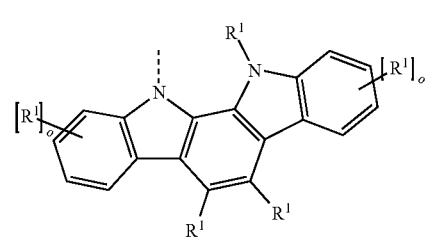

formula (14)

where $R^1$ has the same meaning as described above, the dashed bond represents the link to the triazine unit, and furthermore:

X is, identically or differently on each occurrence, a divalent bridge selected from $B(R^1)$, $C(R^1)_2$, $Si(R^1)_2$, $C=O$, $C=NR^1$, $C=C(R^1)_2$, O, S, $S=O$, $SO_2$, $N(R^1)$, $P(R^1)$ and $P(=O)R^1$;

m is on each occurrence, identically or differently, 0, 1, 2 or 3;

o is on each occurrence, identically or differently, 0, 1, 2, 3 or 4.

Particularly preferred groups $Ar^2$ are selected from the groups of the following formulae (8a) to (14a):

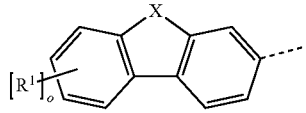

formula (8a)

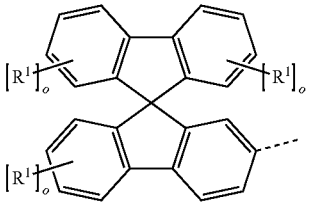

formula (9a)

formula (10a)

formula (11a)

formula (12a)

formula (13a)

formula (14a)

where the symbols and indices used have the same meaning as described above. X here is preferably selected, identically or differently, from $C(R^1)_2$, $N(R^1)$, O and S, particularly preferably $C(R^1)_2$.

Preferred groups $Ar^3$ in compounds of the formula (7) are selected from the groups of the following formulae (15) to (21):

formula (15)

formula (16)

formula (17)

formula (18)

formula (19)

formula (20)

formula (21)

where the symbols and indices used have the same meaning as described above, and the dashed bond represents the link to the two triazine units.

Particularly preferred groups $Ar^3$ are selected from the groups of the following formulae (15a) to (21a):

formula (15a)

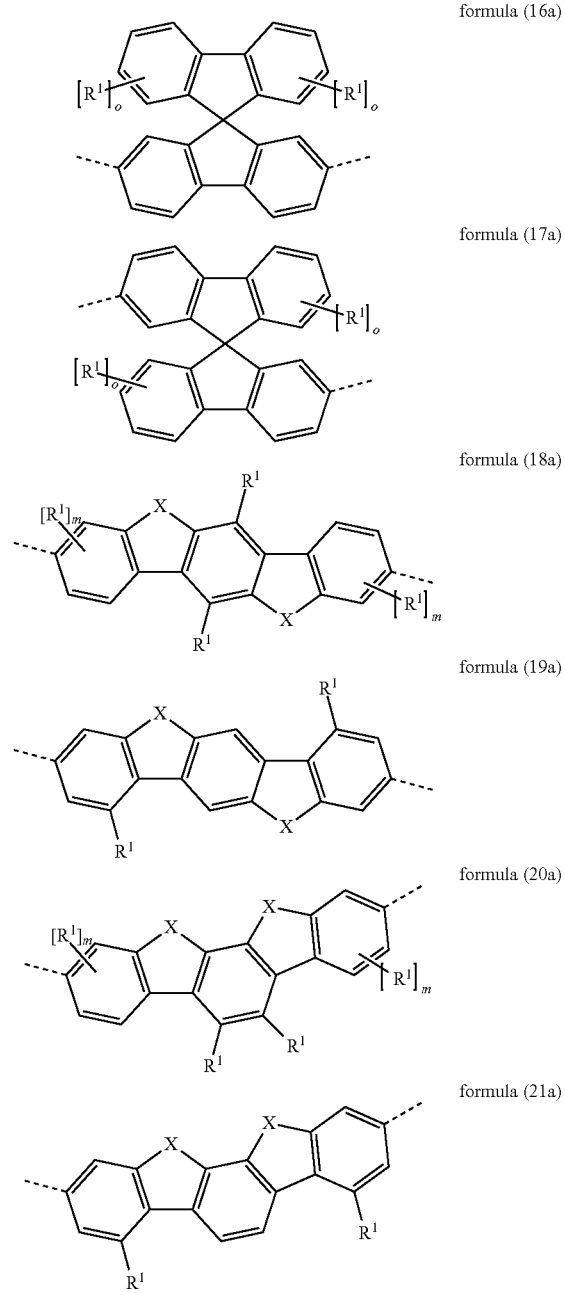

formula (16a)

formula (17a)

formula (18a)

formula (19a)

formula (20a)

formula (21a)

where the symbols and indices used have the same meaning as described above. X here is preferably selected, identically or differently, from $C(R^1)_2$, $N(R^1)$, O and S, particularly preferably $C(R^1)_2$.

Preference is furthermore given to compounds of the formula (7) given above in which the group $Ar^3$ is selected from the formulae (15) to (21) given above, and $Ar^2$ is selected, identically or differently on each occurrence, from the formulae (8) to (14) given above or phenyl, 1- or 2-naphthyl, ortho-, meta- or para-biphenyl, each of which may be substituted by one or more radicals $R^1$, but are preferably unsubstituted.

The hole-conducting compound in interlayer 1 is preferably an aromatic diamine, triamine or tetramine, in which the amino groups are particularly preferably each linked via a non-continuously conjugated group.

Preferred aromatic amines are the compounds of the following formulae (22) to (27):

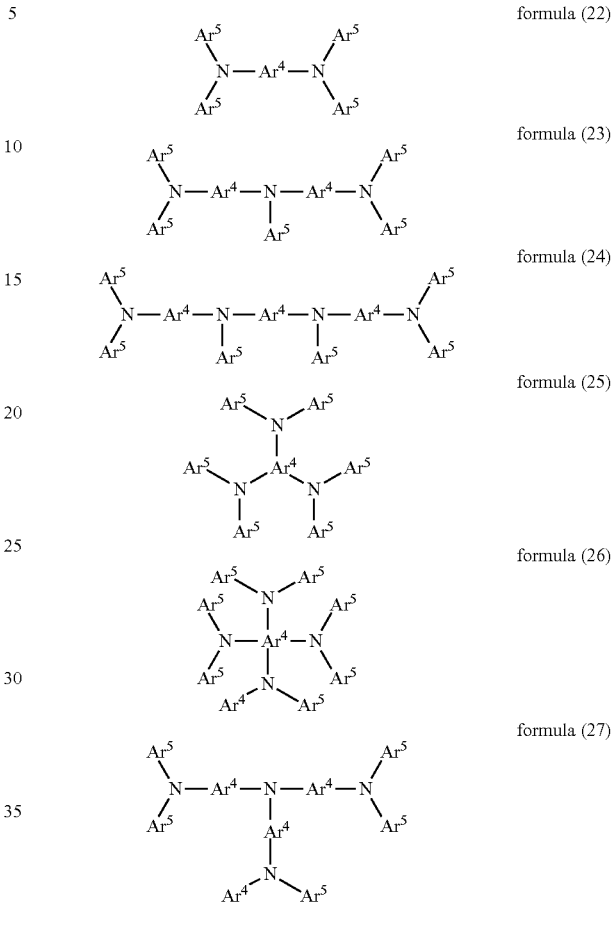

where $R^1$ has the meaning mentioned above, and the following applies to the other symbols used:

$Ar^4$ is on each occurrence, identically or differently, a divalent, trivalent or tetravalent aromatic or heteroaromatic ring system having 5 to 60 aromatic ring atoms, which may be substituted by one or more radicals $R^1$;

$Ar^5$ is on each occurrence, identically or differently, a monovalent aromatic or heteroaromatic ring system having 5 to 60 aromatic ring atoms, which may be substituted by one or more radicals $R^1$; two groups $Ar^5$ here which are bonded to the same nitrogen atom or one group $Ar^4$ with one group $Ar^5$ which are bonded to the same nitrogen atom may be linked to one another by a single bond or a bridge selected from the group consisting of $B(R^1)$, $C(R^1)_2$, $Si(R^1)_2$, C=O, C=$NR^1$, C=$C(R^1)_2$, O, S, S=O, $SO_2$, $N(R^1)$, $P(R^1)$ and P(=O)$R^1$.

If two groups $Ar^5$ or one group $Ar^4$ with one group $Ar^5$ which are each bonded to the same nitrogen atom are linked to one another by a single bond, a carbazole is thus formed.

$Ar^4$ in the compounds of the formulae (22), (23), (24) and (27) is a divalent group and $Ar^4$ in the compounds of the formula (25) is a trivalent group and $Ar^4$ in the compounds of the formula (26) is a tetravalent group.

It is preferred here for $Ar^4$ and $Ar^5$ to contain no condensed aryl or heteroaryl groups having more than 10 aromatic ring atoms. $Ar^4$ and $Ar^5$ particularly preferably contain absolutely no condensed aryl or heteroaryl groups.

It is furthermore preferred for $Ar^4$ not to be continuously conjugated.

For the purposes of the present invention, a non-continuously conjugated aromatic or heteroaromatic ring system is taken to mean an aromatic or heteroaromatic ring system in which the aryl or heteroaryl groups are interrupted by a non-conjugated group, for example an $sp^3$-hybridised carbon atom. For the purposes of the present invention, this is furthermore taken to mean a meta-linked aryl or heteroaryl group, for example a meta-linked phenylene group.

Examples of preferred non-continuously conjugated groups $Ar^4$ are the groups of the formulae (28) to (33) indicated below:

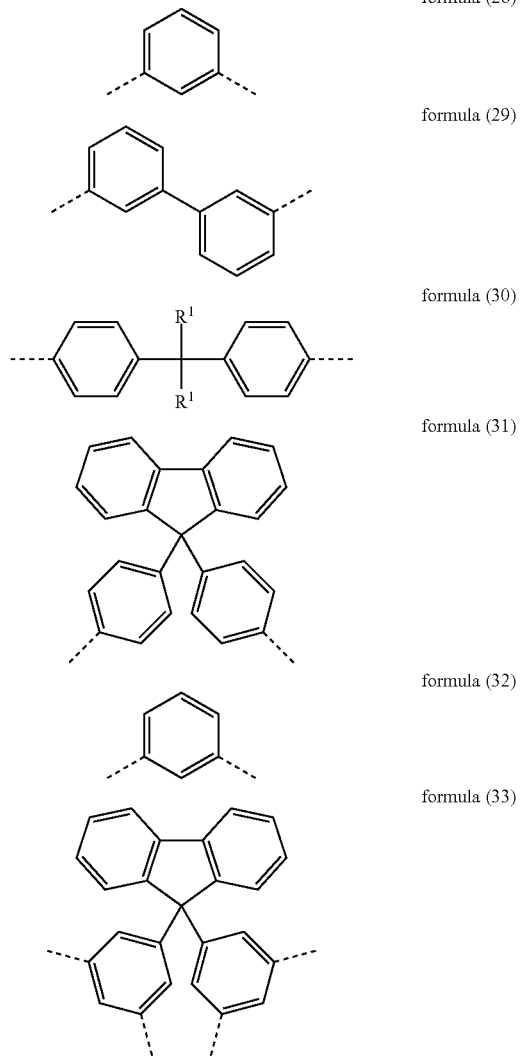

formula (28)

formula (29)

formula (30)

formula (31)

formula (32)

formula (33)

where these structures may also be substituted by one or more radicals $R^1$, and $R^1$ has the meaning mentioned above. It should explicitly again be pointed out at this point that two radicals $R^1$ which are bonded to the same C atom may also form a ring with one another. Thus, for example, if the two radicals $R^1$ in formula (14) stand for alkyl groups, they may form a cyclopentyl or cyclohexyl group with the C atom to which they are bonded.

Further preferred hole-conducting compounds which can be employed in interlayer 1 are diazasilole and tetraazasilole derivatives, in particular having aromatic substituents, as described, for example, in the unpublished application DE 102008056688.8.

Interlayer 2, which is adjacent to the blue-fluorescent emitter layer, is described in greater detail below. The blue-fluorescent layer here is preferably arranged on the cathode side.

In a preferred embodiment of the invention, interlayer 2, which is adjacent to the blue-fluorescent emitter layer, comprises a material which is capable of transporting both electrons and holes. This material preferably has an HOMO of >−5.6 eV, particularly preferably >−5.4 eV, and an LUMO of <−2.4 eV, particularly preferably <−2.6 eV.

In a further preferred embodiment of the invention, interlayer 2, which is adjacent to the blue-fluorescent emitter layer, comprises a mixture of an electron-conducting material and a hole-conducting material.

The hole-conducting material used in interlayer 2 preferably has an HOMO (highest occupied molecular orbital) of >−5.6 eV, particularly preferably >−5.4 eV.

The electron-conducting material used in interlayer 2 preferably has an LUMO (lowest unoccupied molecular orbital) of <−2.4 eV, particularly preferably <−2.6 eV.

In a preferred embodiment of the invention, the electron-conducting material employed in interlayer 2 is the same electron-conducting material as in interlayer 1. The electron-conducting material employed in interlayer 2 is thus preferably an aromatic ketone, in particular of one of the formulae (1) to (5) given above, or a triazine derivative, in particular of one of the formulae (6) and (7) given above.

In a further preferred embodiment of the invention, the electron-conducting material employed in interlayer 2 is the same material that is employed as matrix material in the blue-fluorescent emitter layer. This applies, in particular, if the matrix material in the blue-fluorescent layer is selected from the classes of the oligoarylenes, in particular the oligoarylenes containing condensed aromatic groups, the polypodal metal complexes, the ketones, phosphine oxides, sulfoxides, the boronic acid derivatives, the benzanthracene derivatives and the benzophenanthrene derivatives.

It is advantageous in the production of the electroluminescent device to use materials for interlayer 2 which are already used in other layers of the electroluminescent device, since it is then not necessary to use any additional materials.

In a preferred embodiment of the invention, the hole-conducting material employed in interlayer 2 is an aromatic monoamine, an aromatic diamine, an aromatic triamine or an aromatic tetraamine, in particular an aromatic monoamine or an aromatic diamine.

The hole-conducting material employed in interlayer 2 is particularly preferably one of the materials which is already employed in one of the other layers of the OLED. This may be, in particular, a material which is employed in a hole-injection or hole-transport layer.

The mixing ratio of the hole-conducting compound and the electron-conducting compound in interlayer 2 is preferably between 95:5 and 30:70, particularly preferably between 90:10 and 50:50, in each case based on the volume.

The layer thickness of interlayer 2 is preferably between 1 and 10 nm, particularly preferably between 2 and 7 nm.

The preferred embodiments of the emitting layers and of the other layers of the OLED are indicated below.

In the emitting layers, it is generally possible to use all materials as used in accordance with the prior art.

Preferred embodiments of the phosphorescent compound which is present in the phosphorescent emitter layer are indicated below.

Suitable phosphorescent compounds are, in particular, compounds which emit light, preferably in the visible region, on suitable excitation and in addition contain at least one atom having an atomic number greater than 20, preferably greater than 38 and less than 84, particularly preferably greater than 56 and less than 80. The phosphorescence emitters used are preferably compounds which contain copper, molybdenum, tungsten, rhenium, ruthenium, osmium, rhodium, iridium, palladium, platinum, silver, gold or europium, in particular compounds which contain iridium, platinum or copper.

Particularly preferred organic electroluminescent devices comprise, as phosphorescent compound, at least one compound of the formulae (34) to (37):

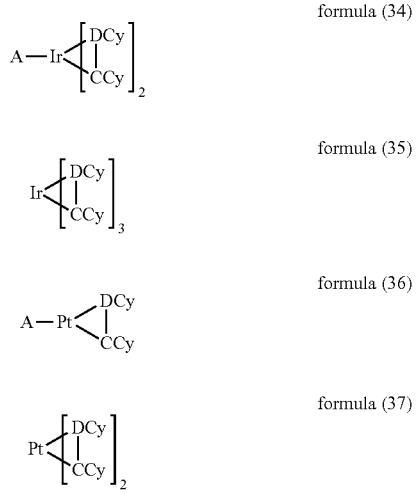

where $R^1$ has the same meaning as described above for formula (1), and the following applies to the other symbols used:

DCy is, identically or differently on each occurrence, a cyclic group which contains at least one donor atom, preferably nitrogen, carbon in the form of a carbene or phosphorus, via which the cyclic group is bonded to the metal, and which may in turn carry one or more substituents $R^1$; the groups DCy and CCy are bonded to one another via a covalent bond;

CCy is, identically or differently on each occurrence, a cyclic group which contains a carbon atom via which the cyclic group is bonded to the metal and which may in turn carry one or more substituents $R^1$;

A is, identically or differently on each occurrence, a monoanionic, bidentate chelating ligand, preferably a diketonate ligand.

Due to formation of ring systems between a plurality of radicals $R^1$, a bridge may also be present between the groups DCy and CCy. Furthermore, due to formation of ring systems between a plurality of radicals $R^1$, a bridge may also be present between two or three ligands CCy-DCy or between one or two ligands CCy-DCy and the ligand A, giving a polydentate or polypodal ligand system.

Examples of the emitters described above are revealed by the applications WO 00/70655, WO 01/41512, WO 02/02714, WO 02/15645, EP 1191613, EP 1191612, EP 1191614, WO 04/081017, WO 05/033244, WO 05/042550, WO 05/113563, WO 06/008069, WO 06/061182, WO 06/081973 and the unpublished application DE 102008027005.9. In general, all phosphorescent complexes as used in accordance with the prior art for phosphorescent OLEDs and as are known to the person skilled in the art in the area of organic electroluminescence are suitable, and the person skilled in the art will be able to use further phosphorescent compounds without inventive step. In particular, the person skilled in the art knows which phosphorescent complexes emit with what emission colour.

The green-phosphorescent compound here is preferably a compound of the formula (35) given above, in particular tris(phenylpyridyl)iridium, which may be substituted by one or more radicals $R^1$.

Suitable matrix materials for the phosphorescent compound are various materials as used in accordance with the prior art as matrix materials for phosphorescent compounds. Suitable matrix materials for the phosphorescent emitter are aromatic ketones, in particular selected from compounds of the formula (1) depicted above or aromatic phosphine oxides or aromatic sulfoxides or sulfones, for example in accordance with WO 04/013080, WO 04/093207, WO 06/005627 or the unpublished application DE 102008033943.1, triarylamines, carbazole derivatives, for example CBP (N,N-biscarbazolyl-biphenyl), mCBP or the carbazole derivatives disclosed in WO 05/039246, US 2005/0069729, JP 2004/288381, EP 1205527 or WO 08/086851, indolocarbazole derivatives, for example in accordance with WO 07/063754 or WO 08/056746, azacarbazole derivatives, for example in accordance with EP 1617710, EP 1617711, EP 1731584, JP 2005/347160, bipolar matrix materials, for example in accordance with WO 07/137725, silanes, for example in accordance with WO 05/111172, azaboroles or boronic esters, for example in accordance with WO 06/117052, triazine derivatives, for example in accordance with the unpublished application DE 102008036982.9, WO 07/063754 or WO 08/056746, zinc complexes, for example in accordance with EP 652273 or WO 09/062578, or diazasilole or tetraazasilole derivatives, for example in accordance with the unpublished application DE 102008056688.8.

In a preferred embodiment of the invention, the matrix material for the phosphorescent compound, if it is an electron-conducting matrix material, is the same material which is also used as electron-conducting material in interlayer 1, which is adjacent to the phosphorescent layer.

It may be advantageous to use a mixture of a hole-conducting matrix material and an electron-conducting matrix material in the phosphorescent emitter layer. This applies, in particular, to the green-phosphorescent emitter layer. This enables the colour location of the white-emitting organic electroluminescent device to be set more simply (see, for example, the unpublished application DE 102008063490.5).

It may furthermore be advantageous to use a mixture of an electron-conducting matrix material and a further matrix material which has neither electron-conducting nor hole-conducting properties in the phosphorescent emitter layer. This enables the efficiency and lifetime of the organic electroluminescent device to be increased (see, for example, the unpublished application DE 102009014513.3).

In a preferred embodiment of the invention, the blue-fluorescent emitter layer comprises a blue-fluorescent dopant and a matrix material.

Suitable blue-fluorescent dopants are selected, for example, from the group of the monostyrylamines, the distyrylamines, the tristyrylamines, the tetrastyrylamines, the styrylphosphines, the styryl ethers and the aryl-amines. A monostyrylamine is taken to mean a compound which contains one substituted or unsubstituted styryl group and at least one, preferably aromatic, amine. A distyrylamine is taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. For the purposes of this invention, an arylamine or aromatic amine is taken to mean a compound which contains three substituted or unsubstituted aromatic or heteroaromatic ring systems bonded directly to the nitrogen. At least one of these aromatic or heteroaromatic ring systems is preferably a condensed ring system, particularly preferably having at least 14 aromatic ring atoms. Preferred examples thereof are aromatic anthracenamines, aromatic pyrenamines, aromatic pyrenediamines, aromatic chrysenamines or aromatic chrysenediamines. An aromatic anthracenamine is taken to mean a compound in which a diarylamino group is bonded directly to an anthracene group, preferably in the 9-position or in the 2-position. Aromatic pyrenamines, pyrenediamines, chrysenamines and chrysenediamines are defined analogously thereto, where the diarylamino groups on the pyrene are preferably bonded in the 1-position or in the 1,6-position. Further preferred dopants are selected from indenofluorenamines or indenofluorenediamines, for example in accordance with WO 06/108497 or WO 06/122630, benzoindenofluorenamines or benzoindenofluorenediamines, for example in accordance with WO 08/006449, and dibenzoindenofluorenamines or dibenzoindenofluorenediamines, for example in accordance with WO 07/140847. Examples of dopants from the class of the styrylamines are substituted or unsubstituted tristilbenamines or the dopants described in WO 06/000388, WO 06/058737, WO 06/000389, WO 07/065549 and WO 07/115610.

Suitable host materials (matrix materials) for the blue-fluorescent dopants, in particular for the above-mentioned dopants, are selected, for example, from the classes of the oligoarylenes (for example 2,2',7,7'-tetraphenylspirobifluorene in accordance with EP 676461 or dinaphthylanthracene), in particular the oligoarylenes containing condensed aromatic groups, the oligoarylenevinylenes (for example DPVBi or spiro-DPVBi in accordance with EP 676461), the polypodal metal complexes (for example in accordance with WO 04/081017), the hole-conducting compounds (for example in accordance with WO 04/058911), the electron-conducting compounds, in particular ketones, phosphine oxides, sulfoxides, etc. (for example in accordance with WO 05/084081 and WO 05/084082), the atropisomers (for example in accordance with WO 06/048268), the boronic acid derivatives (for example in accordance with WO 06/117052), the benzanthracene derivatives (for example benz[a]anthracene derivatives in accordance with WO 08/145239) and the benzophenanthrene derivatives (for example benz[c]phenanthrene derivatives in accordance with the unpublished application DE 102009005746.3). Particularly preferred host materials are selected from the classes of the oligoarylenes, containing naphthalene, anthracene, benzanthracene, in particular benz[a]anthracene, benzophenanthrene, in particular benz[c]phenanthrene, and/or pyrene, or atropisomers of these compounds. For the purposes of this invention, an oligoarylene is intended to be taken to mean a compound in which at least three aryl or arylene groups are bonded to one another.

Apart from the cathode, the anode, the emitting layers and the interlayers which have been described above, the organic electroluminescent device may also comprise further layers which are not depicted in FIG. 1. These are selected, for example, from in each case one or more hole-injection layers, hole-transport layers, hole-blocking layers, electron-transport layers, electron-injection layers, electron-blocking layers, exciton-blocking layers, charge-generation layers and/or organic or inorganic p/n junctions. In addition, further interlayers may be present. Furthermore, the use of more than three emitting layers may also be preferred. Furthermore, the layers, in particular the charge-transport layers, may also be doped. The doping of the layers may be advantageous for improved charge transport. However, it should be pointed out that each of these layers does not necessarily have to be present, and the choice of the layers is always dependent on the compounds used.

The use of layers of this type is known to the person skilled in the art, and he will be able, without inventive step, to use all materials in accordance with the prior art which are known for layers of this type for this purpose.

The cathode of the electroluminescent device according to the invention preferably comprises metals having a low work function, metal alloys or multilayered structures comprising different metals, such as, for example, alkaline-earth metals, alkali metals, main-group metals or lanthanoids (for example Ca, Ba, Mg, Al, In, Mg, Yb, Sm, etc.). In the case of multi-layered structures, further metals which have a relatively high work function, such as, for example, Ag, may also be used in addition to the said metals, in which case combinations of the metals, such as, for example, Ca/Ag or Ba/Ag, are generally used. Preference is likewise given to metal alloys, in particular alloys comprising an alkali metal or alkaline-earth metal and silver, particularly preferably an alloy of Mg and Ag. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, CsF, $Cs_2CO_3$, $BaF_2$, MgO, NaF, etc.). The layer thickness of this layer is preferably between 0.5 and 5 nm.

The anode of the electroluminescent device according to the invention preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/NiO$_x$, Al/PtO$_x$) may also be preferred. At least one of the electrodes here must be transparent in order to facilitate the coupling-out of light. A preferred structure uses a transparent anode. Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally hermetically sealed, since the lifetime of devices of this type is drastically shortened in the presence of water and/or air.

It is generally possible to employ all further materials as employed in accordance with the prior art in organic electroluminescent devices, also in combination with the interlayers according to the invention.

Suitable charge-transport materials, as can be used in the hole-injection or hole-transport layer or in the electron-transport layer of the organic electroluminescent device according to the invention, are, for example, the compounds disclosed in Y. Shirota et al., Chem. Rev. 2007, 107(4), 953-1010, or other materials as employed in accordance with the prior art in these layers.

Examples of preferred hole-transport materials which can be used in a hole-transport or hole-injection layer in the electroluminescent device according to the invention are indenofluorenamines and derivatives (for example in accordance with WO 06/122630 or WO 06/100896), the amine derivatives disclosed in EP 1661888, hexaazatriphenylene derivatives (for example in accordance with WO 01/049806), amine derivatives containing condensed aromatic ring systems (for example in accordance with U.S. Pat. No. 5,061, 569), the amine derivatives disclosed in WO 95/09147, monobenzoindenofluorenamines (for example in accordance with WO 08/006449) or dibenzoindenofluorenamines (for example in accordance with WO 07/140847). Hole-transport and hole-injection materials which are furthermore suitable are derivatives of the compounds depicted above, as disclosed in JP 2001/226331, EP 676461, EP 650955, WO 01/049806, U.S. Pat. No. 4,780,536, WO 98/30071, EP 891121, EP 1661888, JP 2006/253445, EP 650955, WO 06/073054 and U.S. Pat. No. 5,061,569.

Suitable hole-transport or hole-injection materials are furthermore, for example, the materials listed in the following table.

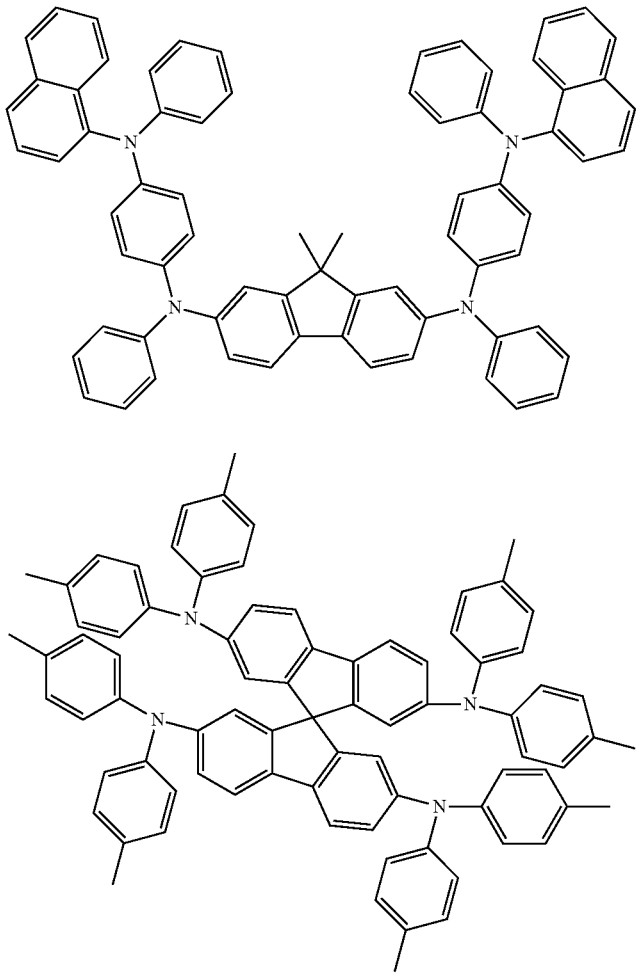

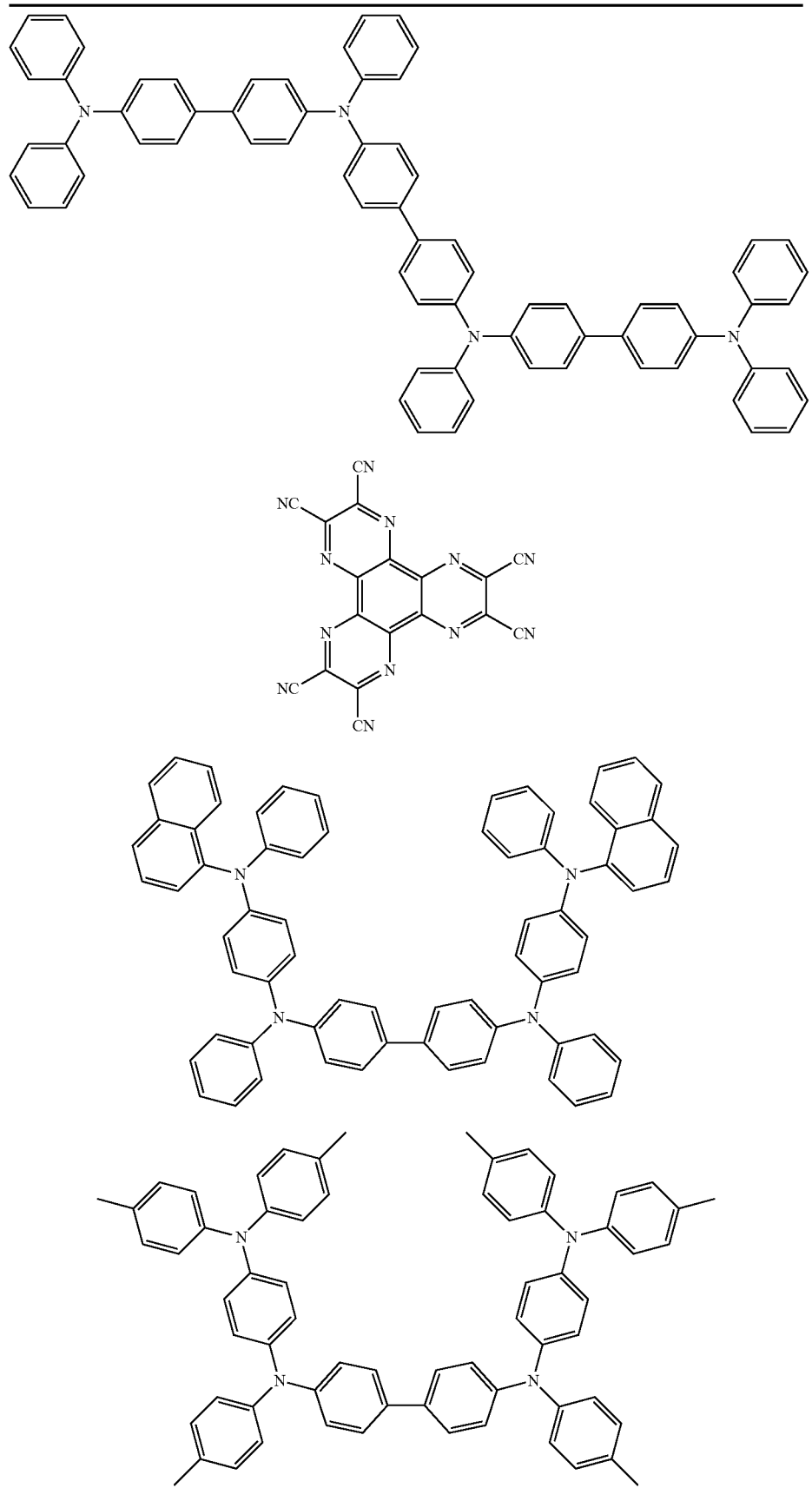

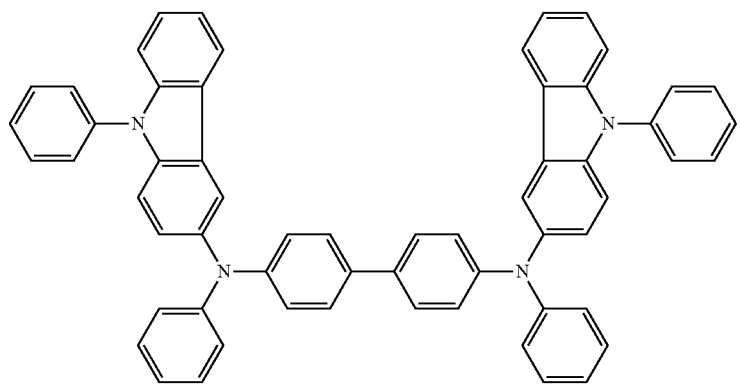 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1]
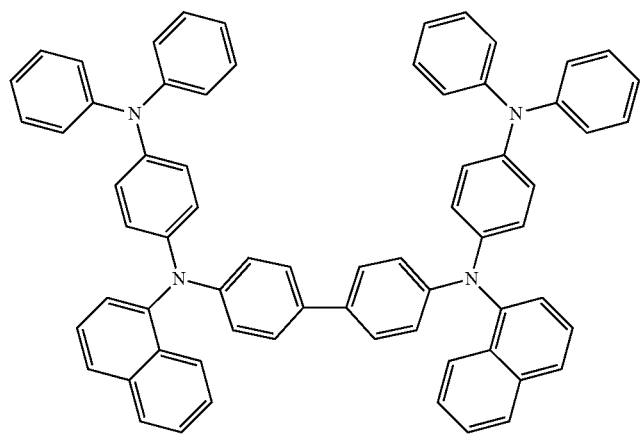 [SMILES: c1ccc(N(c2ccccc2)c2ccc(N(c3ccc(-c4ccc(N(c5ccc(N(c6ccccc6)c6ccccc6)cc5)c5cccc6ccccc56)cc4)cc3)c3cccc4ccccc34)cc2)cc1]
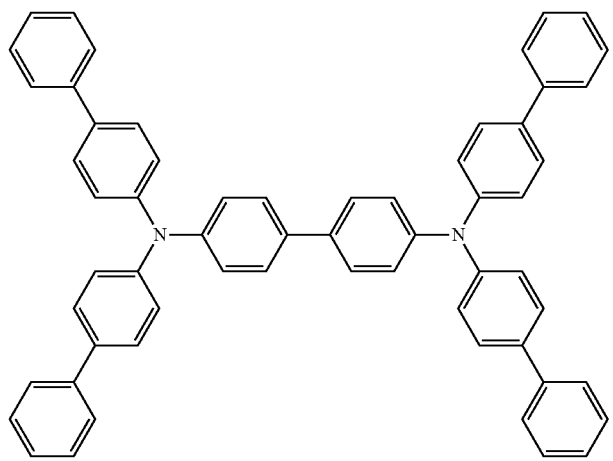 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

-continued
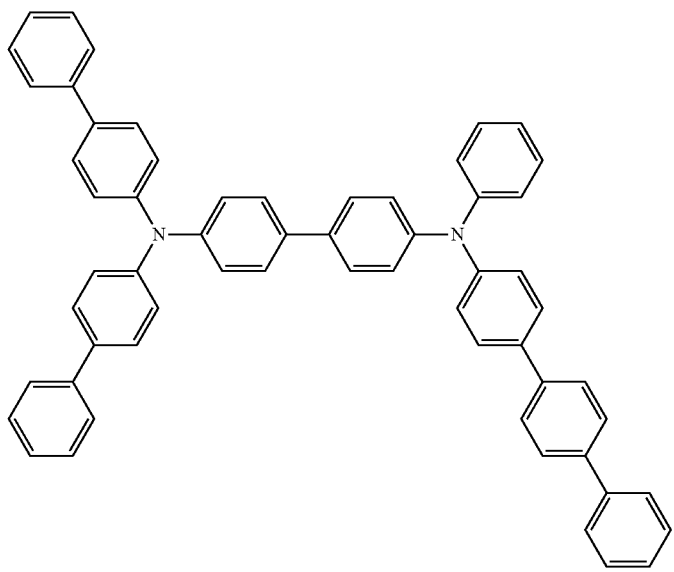 [SMILES: c1ccc(-c2ccc(-c3ccc(N(c4ccccc4)c4ccc(-c5ccc(N(c6ccc(-c7ccccc7)cc6)c6ccc(-c7ccccc7)cc6)cc5)cc4)cc3)cc2)cc1]
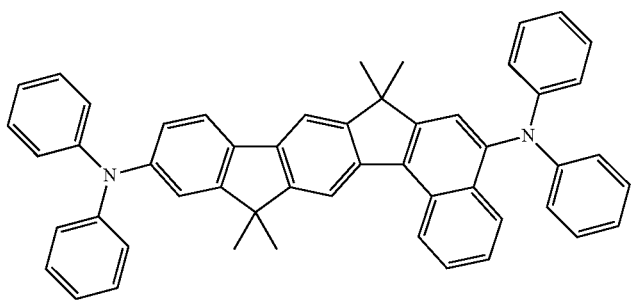 [SMILES: CC1(C)c2cc(N(c3ccccc3)c3ccccc3)ccc2-c2cc3c(cc21)-c1c(cc(N(c2ccccc2)c2ccccc2)c2ccccc12)C3(C)C]
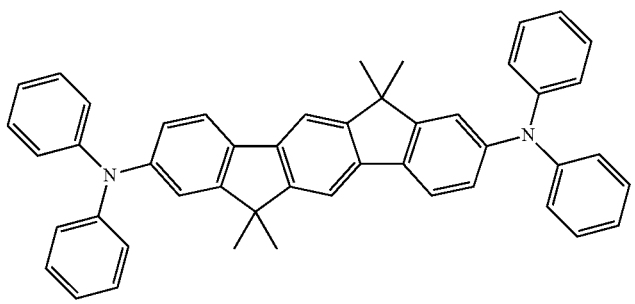 [SMILES: CC1(C)c2cc(N(c3ccccc3)c3ccccc3)ccc2-c2cc3c(cc21)-c1ccc(N(c2ccccc2)c2ccccc2)cc1C3(C)C]
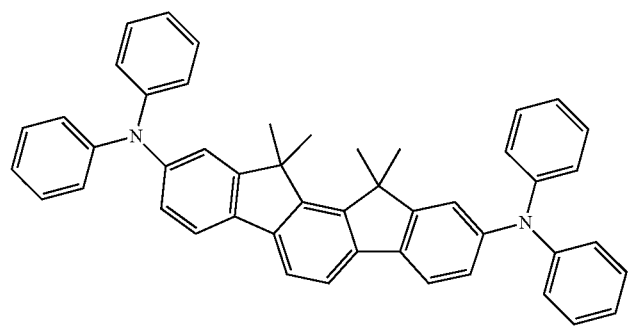 [SMILES: CC1(C)c2cc(N(c3ccccc3)c3ccccc3)ccc2-c2ccc3c(c21)C(C)(C)c1cc(N(c2ccccc2)c2ccccc2)ccc1-3]

-continued
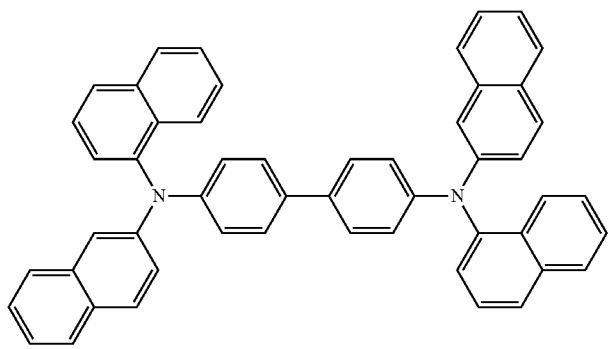 [SMILES: c1ccc2cc(N(c3ccc(-c4ccc(N(c5ccc6ccccc6c5)c5cccc6ccccc56)cc4)cc3)c3cccc4ccccc34)ccc2c1]
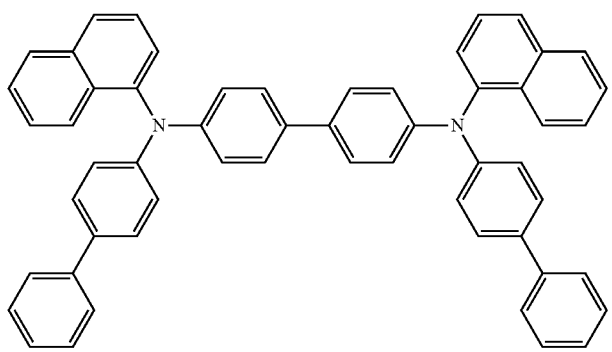 [SMILES: c1ccc(-c2ccc(N(c3ccc(-c4ccc(N(c5ccc(-c6ccccc6)cc5)c5cccc6ccccc56)cc4)cc3)c3cccc4ccccc34)cc2)cc1]
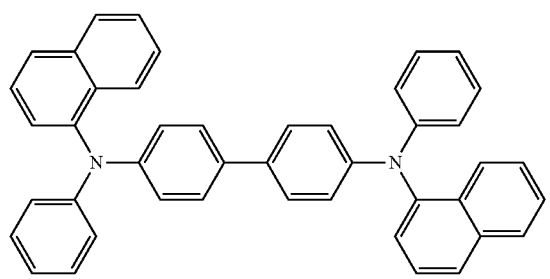 [SMILES: c1ccc(N(c2ccc(-c3ccc(N(c4ccccc4)c4cccc5ccccc45)cc3)cc2)c2cccc3ccccc23)cc1]
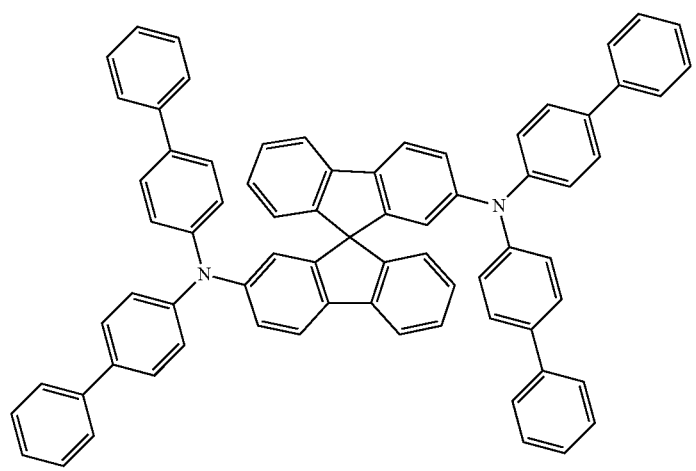 [SMILES: c1ccc(-c2ccc(N(c3ccc(-c4ccccc4)cc3)c3ccc4c(c3)C3(c5ccccc5-4)c4ccccc4-c4ccc(N(c5ccc(-c6ccccc6)cc5)c5ccc(-c6ccccc6)cc5)cc43)cc2)cc1]

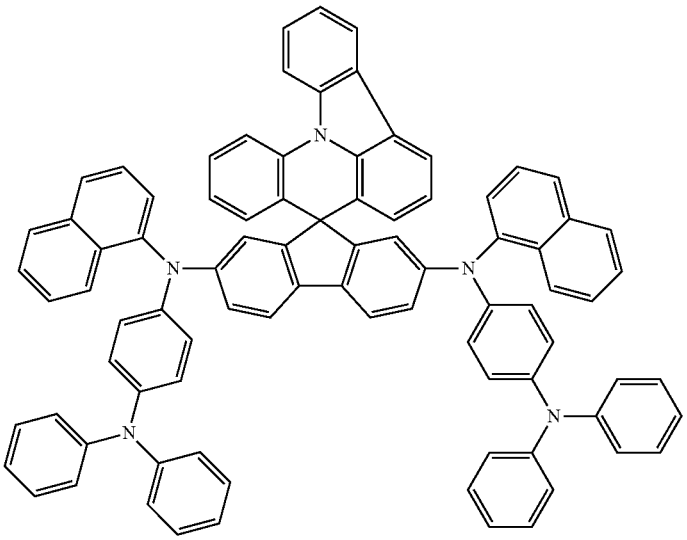 [SMILES: c1ccc(N(c2ccccc2)c2ccc(N(c3ccc4c(c3)C3(c5cc(N(c6ccc(N(c7ccccc7)c7ccccc7)cc6)c6cccc7ccccc67)ccc5-4)c4ccccc4-n4c5ccccc5c5cccc3c54)c3cccc4ccccc34)cc2)cc1]

Materials which can be used for the electron-transport layer are all materials as used in accordance with the prior art as electron-transport materials in the electron-transport layer. Particularly suitable are aluminium complexes, for example $Alq_3$, zirconium complexes, for example $Zrq_4$, benzimidazole derivatives, triazine derivatives or aromatic ketones, for example compounds of the formulae (1) to (5) given above. Suitable materials are, for example, the materials listed in the following table. Other suitable materials are derivatives of the compounds depicted above, as disclosed in JP 2000/053957, WO 03/060956, WO 04/028217 and WO 04/080975.

It may also be preferred to employ two separate electron-transport layers. This may have advantages with respect to the luminance dependence of the colour location of the electroluminescent device (see, for example, the unpublished application DE 102009012346.6).

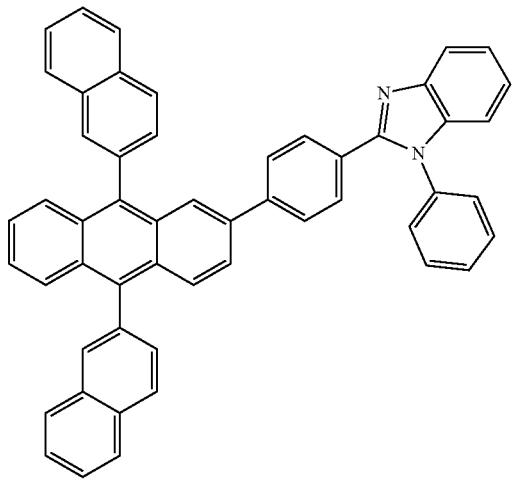

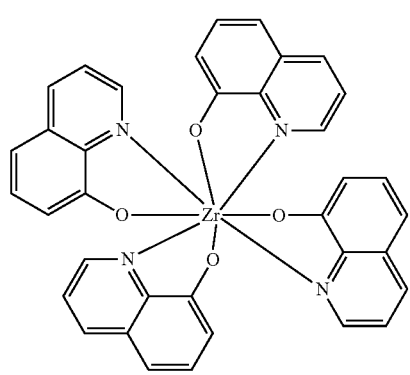

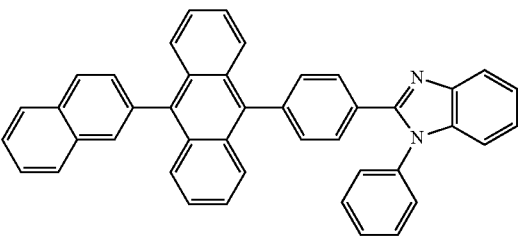

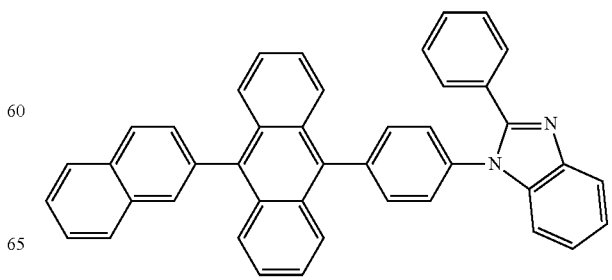

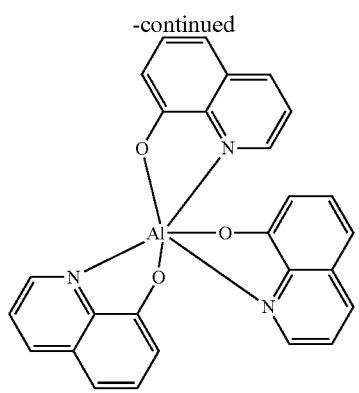

It is furthermore possible for the electron-transport layer to be doped. Suitable dopants are alkali metals or alkali-metal compounds, such as, for example, Liq (lithium quinolinate). In a preferred embodiment of the invention, the electron-transport layer is doped, in particular, when the electron-transport material is a benzimidazole derivative or a triazine derivative. The preferred dopant is then Liq.

Preference is furthermore given to an organic electroluminescent device, characterised in that one or more layers are applied by means of a sublimation process, in which the materials are vapour-deposited in vacuum sublimation units at an initial pressure of less than $10^{-5}$ mbar, preferably less than $10^{-6}$ mbar. However, it should be noted that the pressure may also be even lower, for example less than $10^{-7}$ mbar.

Preference is likewise given to an organic electroluminescent device, characterised in that one or more layers are applied by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing, LITI (light induced thermal imaging, thermal transfer printing), inkjet printing or nozzle printing. Soluble compounds are necessary for this purpose. High solubility can be achieved through suitable substitution of the compounds. It is possible here not only for solutions of individual materials to be applied, but also solutions which comprise a plurality of compounds, for example matrix materials and dopants.

The organic electroluminescent device can also be produced by applying one or more layers from solution and applying one or more other layers by vapour deposition.

These processes are generally known to the person skilled in the art and can be applied by him without inventive step to the organic electroluminescent devices according to the invention.

The organic electroluminescent device according to the invention has the following surprising advantages over the prior art:

1. The organic electroluminescent device according to the invention has very high efficiency due to the use of two interlayers. In particular, the efficiency is higher than on use of only one interlayer.

2. The organic electroluminescent device according to the invention at the same time has a very good lifetime. In contrast to the prior art, this increase in efficiency is thus not accompanied by an impairment of the lifetime.

The invention is described in greater detail by the following examples without wishing to restrict it thereby. The person skilled in the art will be able, without being inventive, to carry out the invention throughout the range disclosed and thus produce further organic electroluminescent devices according to the invention.

EXAMPLES

Production and Characterisation of Organic Electroluminescent Devices in Accordance with the Invention Electroluminescent devices according to the invention can be produced as described in general, for example, in WO 05/003253. The structures of the materials used are depicted below for clarity.

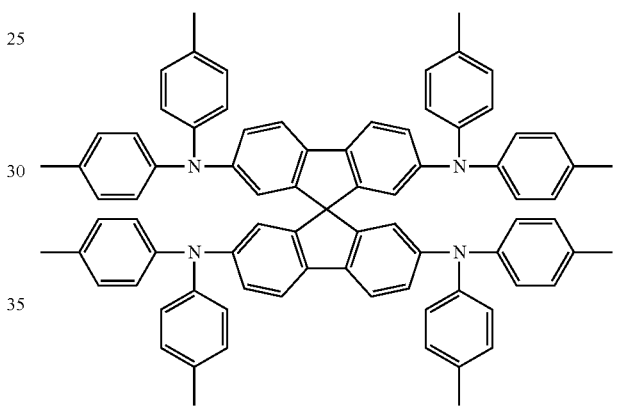

HIM

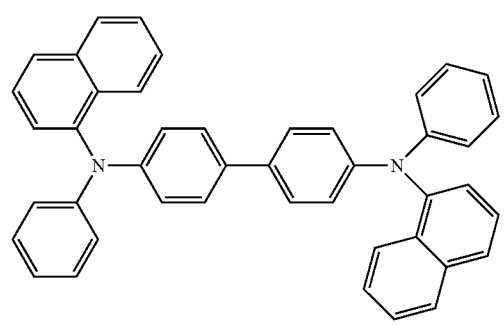

NPB

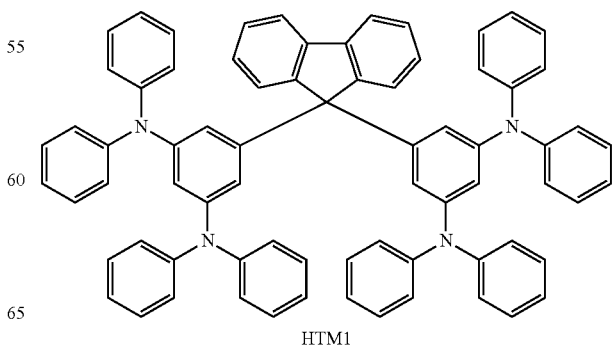

HTM1

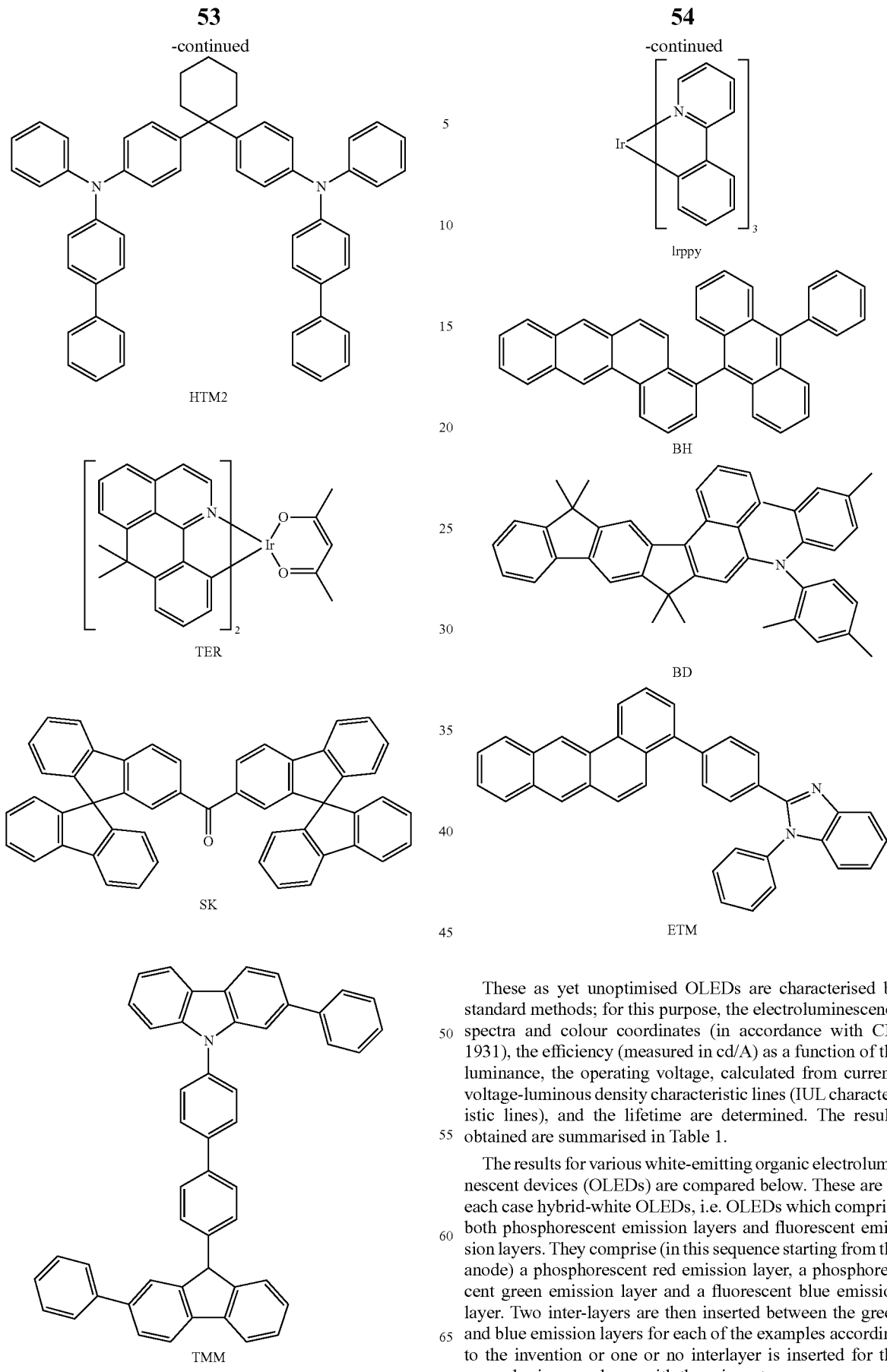

These as yet unoptimised OLEDs are characterised by standard methods; for this purpose, the electroluminescence spectra and colour coordinates (in accordance with CIE 1931), the efficiency (measured in cd/A) as a function of the luminance, the operating voltage, calculated from current-voltage-luminous density characteristic lines (IUL characteristic lines), and the lifetime are determined. The results obtained are summarised in Table 1.

The results for various white-emitting organic electroluminescent devices (OLEDs) are compared below. These are in each case hybrid-white OLEDs, i.e. OLEDs which comprise both phosphorescent emission layers and fluorescent emission layers. They comprise (in this sequence starting from the anode) a phosphorescent red emission layer, a phosphorescent green emission layer and a fluorescent blue emission layer. Two inter-layers are then inserted between the green and blue emission layers for each of the examples according to the invention or one or no interlayer is inserted for the examples in accordance with the prior art.

Example 1

According to the Invention

Example 1 is achieved by the following layer structure: 40 nm of HIM, 10 nm of NPB doped with 7% of TER, 8 nm of mixed layer consisting of 70% of TMM, 15% of SK and 15% of Irppy, 3 nm of mixed layer consisting of 80% of HTM2 and 20% of SK, 3 nm of mixed layer consisting of 80% of NPB and 20% of BH, 25 nm of BH doped with 5% of BD, 5 nm of SK, 25 nm of ETM, 1 nm of LiF, 100 nm of Al.

Example 2

According to the Invention

Example 2 is achieved by the following layer structure: 40 nm of HIM, 10 nm of NPB doped with 7% of TER, 8 nm of mixed layer consisting of 70% of TMM, 15% of SK and 15% of Irppy, 3 nm of mixed layer consisting of 80% of HTM1 and 20% of SK, 3 nm of mixed layer consisting of 80% of NPB and 20% of BH, 25 nm of BH doped with 5% of BD, 5 nm of SK, 25 nm of ETM, 1 nm of LiF, 100 nm of Al.

The OLEDs from Examples 1 and 2, which each comprise two interlayers matched to one another, where the first interlayer, which is adjacent to the green emitter layer, in each case comprises only materials which have an adequately high triplet energy in order not to extinguish any green emission, exhibit both high efficiency and a good operating lifetime.

Example 3

Comparison

Example 3 is achieved by the following layer structure: 40 nm of HIM, 10 nm of NPB doped with 7% of TER, 8 nm of mixed layer consisting of 70% of TMM, 15% of SK and 15% of Irppy, 6 nm of mixed layer consisting of 80% of HTM2 and 20% of SK, 25 nm of BH doped with 5% of BD, 5 nm of SK, 25 nm of ETM, 1 nm of LiF, 100 nm of Al.

Example 4

Comparison

Example 4 is achieved by the following layer structure: 40 nm of HIM, 10 nm of NPB doped with 7% of TER, 8 nm of mixed layer consisting of 70% of TMM, 15% of SK and 15% of Irppy, 6 nm of mixed layer consisting of 80% of HTM1 and 20% of SK, 25 nm of BH doped with 5% of BD, 5 nm of SK, 25 nm of ETM, 1 nm of LiF, 100 nm of Al.

Examples 3 and 4 in accordance with the prior art correspond to Examples 1 and 2 according to the invention with the difference that in each case the second interlayer between the phosphorescent emitter layer and the fluorescent emitter layer is omitted and to make up for this the interlayer present is selected to be twice as thick. These OLEDs also exhibit high efficiency since only materials which have an adequately high triplet energy for green triplet emission are employed in the now single interlayer. However, it is found that a very poor operating lifetime occurs due to the use of only one interlayer.

Example 5

Comparison

Example 5 is achieved by the following layer structure: 40 nm of HIM, 10 nm of NPB doped with 7% of TER, 11 nm of mixed layer consisting of 70% of TMM, 15% of SK and 15% of Irppy, 6 nm of mixed layer consisting of 80% of NPB and 20% of SK, 25 nm of BH doped with 5% of BD, 5 nm of SK, 25 nm of ETM, 1 nm of LiF, 100 nm of Al.

Example 5 in accordance with the prior art corresponds to Example 2 according to the invention with the difference that interlayer 1, which is adjacent to the phosphorescent emitter layer, is omitted. Although this OLED again has a good operating lifetime, it has, however, low efficiency, possibly since a material, NPB, which extinguishes green emission owing to the excessively low triplet energy, is adjacent to the green emission layer. In order, for better comparison, to obtain a similar colour as in the previous examples, the thickness of the green emission layer must therefore also be increased from 8 to 11 nm. Analogous results are also obtained if, for example, interlayer 2 from Example 1 or other materials having low triplet energy are used as interlayer.

Example 6

Comparison

Example 6 is achieved by the following layer structure: 40 nm of HIM, 10 nm of NPB doped with 7% of TER, 11 nm of mixed layer consisting of 70% of TMM, 15% of SK and 15% of Irppy, 25 nm of BH doped with 5% of BD, 5 nm of SK, 25 nm of ETM, 1 nm of LiF, 100 nm of Al.

Finally, Example 6 in accordance with the prior art represents the OLED with absolutely no interlayer between the phosphorescent emitter layer and the fluorescent emitter layer. In this case too, low efficiency is obtained, presumably since the green emission is extinguished at BH and BD, which have low triplet energy.

Overall, the examples clearly show that, in order to obtain high efficiency, as known in the prior art, an interlayer which must not comprise any materials having excessively low triplet energy must be inserted between the blue emission layer and the green emission layer, but that at the same time a good operating lifetime is only achieved by inserting a suitable second interlayer adjacent to this interlayer.

TABLE 1

| | | | Device results | | | |
|---|---|---|---|---|---|---|
| Ex. | Interlayer 1 | Interlayer 2 | Efficiency [cd/A] at 1000 cd/m$^2$ | Voltage [V] at 1000 cd/m$^2$ | CIE x/y at 1000 cd/m$^2$ | Lifetime 50% [h], initial luminance 1000 cd/m$^2$ |
| 1 | HTM2:SK (4:1) | NPB:BH (4:1) | 20 | 4.4 | 0.30/0.32 | 11000 |
| 2 | HTM1:SK (4:1) | NPB:SK (4:1) | 21 | 4.6 | 0.31/0.32 | 9000 |
| 3 comp. | HTM2:SK (4:1) | — | 22 | 4.8 | 0.29/0.31 | 1600 |
| 4 comp. | HTM1:SK (4:1) | — | 21 | 4.8 | 0.30/0.31 | 900 |

TABLE 1-continued

Device results

| Ex. | Interlayer 1 | Interlayer 2 | Efficiency [cd/A] at 1000 cd/m² | Voltage [V] at 1000 cd/m² | CIE x/y at 1000 cd/m² | Lifetime 50% [h], initial luminance 1000 cd/m² |
|---|---|---|---|---|---|---|
| 5 comp. | NPB:SK (4:1) | — | 12 | 4.5 | 0.30/0.32 | 9000 |
| 6 comp. | — | — | 13 | 4.8 | 0.30/0.32 | 12000 |

The invention claimed is:

1. An organic electroluminescent device comprising at least one blue-fluorescent emitter layer and at least one further emitter layer which is a phosphorescent emitter layer, wherein at least two interlayers 1 and 2 are inserted between the blue-fluorescent emitter layer and the next phosphorescent emitter layer, where interlayer 1 is adjacent to the phosphorescent emitter layer, comprises a mixture of an electron-conducting material and a hole-conducting material, where both the hole-conducting material and the electron-conducting material have a triplet energy greater than the triplet energy of the emitter of the adjacent phosphorescent emitter layer, and in that the interlayer 2, which is adjacent to the blue-fluorescent emitter layer, comprises a mixture of an electron-conducting material and a hole-conducting material.

2. The organic electroluminescent device of claim 1, wherein the phosphorescent emitter layer is a yellow- or orange-phosphorescent emitter layer if the electroluminescent device has two emitter layers and the phosphorescent emitter layers are a red-or orange-phosphorescent emitter layer and a green-phosphorescent emitter layer if the electroluminescent device has three emitter layers.

3. The organic electroluminescent device of claim 1, wherein the blue-fluorescent emitter layer is arranged on the cathode side.

4. The organic electroluminescent device of claim 1, whereinthe electron-conducting material of interlayer 1 is an aromatic ketone of formula (1)

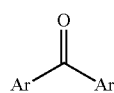

formula (1)

wherein

Ar is on each occurrence, identically or differently, an aromatic or heteroaromatic ring system having 5 to 60 aromatic ring atoms optionally substituted by one or more groups $R^1$;

$R^1$ is on each occurrence, identically or differently, H, D, F, Cl, Br, I, CHO, C(=O)Ar$^1$, P(=O)(Ar$^1$)$_2$, S(=O)Ar$^1$, S(=O)$_2$Ar$^1$, CR$^2$=CR$^2$Ar$^1$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which are optionally substituted by one or more radicals R$^2$, wherein one or more non-adjacent CH$_2$ groups are optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and wherein one or more H atoms are optionally replaced by D, F, Cl, Br, I, CN or NO$_2$, or an aromatic or heteroaromatic ring system having 5 to 60 aromatic ring atoms optionally substituted by one or more radicals R$^2$, or an aryloxy or heteroaryloxy group having 5 to 60 aromatic ring atoms, optionally substituted by one or more radicals R$^2$, or a combination of these systems; and wherein two or more adjacent substituents R$^1$ optionally define a mono- or polycyclic, aliphatic or aromatic ring system with one another;

Ar$^1$ is on each occurrence, identically or differently, an aromatic or heteroaromatic ring system having 5 to 40 aromatic ring atoms optionally substituted by one or more radicals R$^2$;

R$^2$ is on each occurrence, identically or differently, H, D, CN or an aliphatic, aromatic and/or heteroaromatic hydrocarbon radical having 1 to 20 C atoms, in which, in addition, H atoms are optionally replaced by D or F; and wherein two or more adjacent substituents R$^2$ optionally define a mono- or polycyclic, aliphatic or aromatic ring system with one another.

5. The organic electroluminescent device of claim 4, wherein the aromatic ketone is a compound of one of formulae (2) to (5):

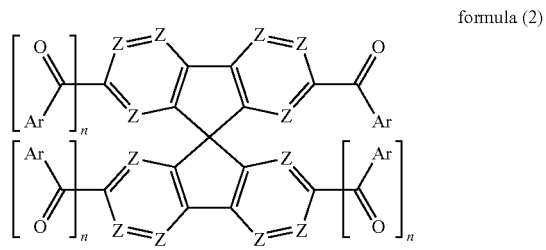

formula (2)

formula (3)

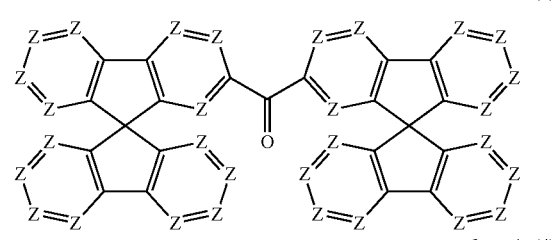

formula (4)

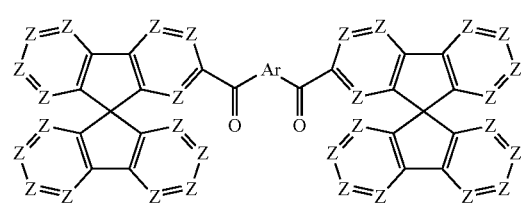

-continued

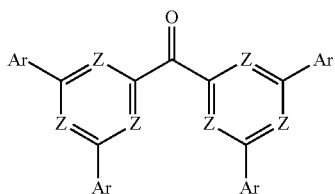

formula (5)

wherein

Z is, identically or differently on each occurrence, $CR^1$ or N; and n is, identically or differently on each occurrence, 0 or 1.

6. The organic electroluminescent device of claim 1, wherein the electron-conducting material of interlayer 1 is a compound of formula (6) or (7):

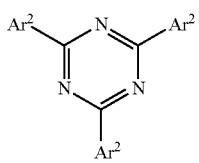

formula (6)

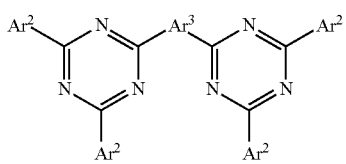

formula (7)

wherein $Ar^2$ is, identically or differently on each occurrence, a monovalent aromatic or heteroaromatic ring system having 5 to 60 aromatic ring atoms optionally substituted by one or more radicals $R^1$;

$Ar^3$ is a divalent aromatic or heteroaromatic ring system having 5 to 60 aromatic ring atoms optionally substituted by one or more radicals $R^1$.

7. The organic electroluminescent device of claim 1, wherein the hole-conducting compound in interlayer 1 is a diazasilole derivative or a tetraazasilole derivative or an aromatic amine of one of formulae (22) to (27):

formula (22)

formula (23)

formula (24)

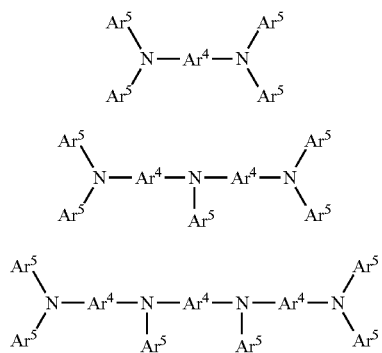

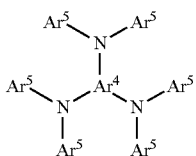

formula (25)

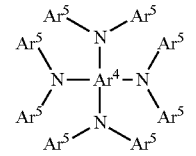

formula (26)

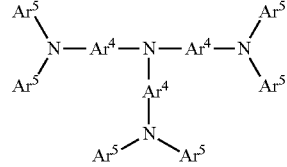

formula (27)

wherein $Ar^4$ is on each occurrence, identically or differently, a divalent, trivalent or tetravalent aromatic or heteroaromatic ring system having 5 to 60 aromatic ring atoms optionally substituted by one or more radicals $R^1$;

$Ar^5$ is on each occurrence, identically or differently, a monovalent aromatic or heteroaromatic ring system having 5 to 60 aromatic ring atoms optionally substituted by one or more radicals $R^1$; wherein two groups $Ar^5$ which are bonded to the same nitrogen atom or one group $Ar^4$ with one group $Ar^5$ which are bonded to the same nitrogen atom are optionally linked to one another by a single bond or a bridge selected from the group consisting of $B(R^1)$, $C(R^1)_2$, $Si(R^1)_2$, $C=O$, $C=NR^1$, $C=C(R^1)_2$, $O$, $S$, $S=O$, $SO_2$, $N(R^1)$, $P(R^1)$, and $P(=O)R^1$.

8. The organic electroluminescent device of claim 7, wherein the groups $Ar^4$ are selected from the groups of formulae (28) to (33):

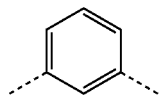

formula (28)

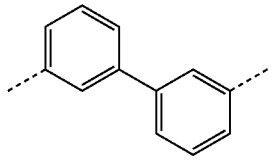

formula (29)

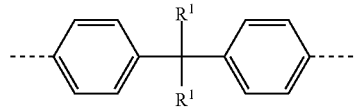

formula (30)

-continued

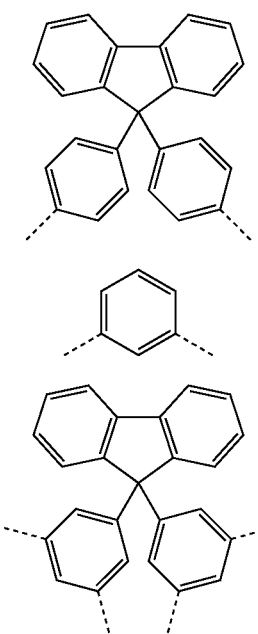

formula (31)

formula (32)

formula (33)

wherein these structures are optionally substituted by one or more radicals $R^1$ which is, on each occurrence, identically or differently, H, D, F, Cl, Br, I, CHO, C(=O)$Ar^1$, P(=O)$(Ar^1)_2$, S(=O)$Ar^1$, S(=O)$_2Ar^1$, $CR^2$=$CR^2Ar^1$, CN, $NO_2$, Si$(R^2)_3$, B$(OR^2)_2$, B$(R^2)_2$, B$(N(R^2)_2)_2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which are optionally substituted by one or more radicals $R^2$, wherein one or more non-adjacent $CH_2$ groups are optionally replaced by $R^2C$=$CR^2$, C≡C, Si$(R^2)_2$, Ge$(R^2)_2$, Sn$(R^2)_2$, CO,=C=S, C=Se, C=$NR^2$, P(=O)$(R^2)$, SO, $SO_2$, $NR^2$, O, S or $CONR^2$ and wherein one or more H atoms are optionally replaced by D, F, Cl, Br, I, CN or $NO_2$, or an aromatic or heteroaromatic ring system having 5 to 60 aromatic ring atoms optionally substituted by one or more radicals $R^2$, or an aryloxy or heteroaryloxy group having 5 to 60 aromatic ring atoms, optionally substituted by one or more radicals $R^2$, or a combination of these systems; and wherein two or more adjacent substituents $R^1$ optionally define a mono- or polycyclic, aliphatic or aromatic ring system with one another.

9. The organic electroluminescent device of claim 1, wherein the electron-conducting material employed in interlayer 2 is the same material as that in interlayer 1 or in that the same material is employed which is employed as matrix material in the blue-fluorescent emitter layer.

10. The organic electroluminescent device of claim 1, wherein the hole-conducting material employed in interlayer 2, which is adjacent to the fluorescent emitter layer, is an aromatic amine.

11. The organic electroluminescent device of claim 1, wherein the mixing ratio of the hole-conducting compound and the electron-conducting compound in interlayer 1 and/or in interlayer 2 is between 95:5 and 30:70, based on the volume.

12. The organic electroluminescent device of claim 1, wherein the layer thickness of interlayer 1 and/or interlayer 2 is in each case between 1 and 10 nm.

13. The organic electroluminescent device of claim 1, wherein the phosphorescent compound is selected from compounds of formulae (34) to (37):

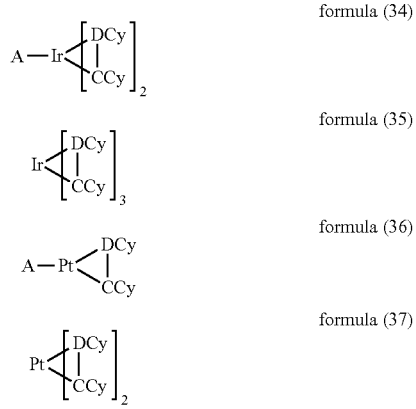

formula (34)

formula (35)

formula (36)

formula (37)

wherein $R^1$ is, on each occurrence, identically or differently, H, D, F, Cl, Br, I, CHO, C(=O)$Ar^1$,P(=O)$(Ar^1)_2$, S(=O)$Ar^1$, S(=O)$_2Ar^1$ $CR^2$=$CR^2Ar^1$, CN, $NO_2$, Si$(R^2)_3$, B$(OR^2)_2$, B$(R^2)_2$, B$(N(R^2)_2)_2$, $OSO_2R^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which are optionally substituted by one or more radicals $R^2$, wherein one or more non-adjacent $CH_2$ groups are optionally replaced by $R^2C$=$CR^2$, C≡C, Si$(R^2)_2$, Ge$(R^2)_2$, Sn$(R^2)_2$, C=O, C=S, C=Se, C=$NR^2$, P(=O)$(R^2)$, SO, $SO_2$, $NR^2$, O, S or $CONR^2$ and wherein one or more H atoms are optionally replaced by D, F, Cl, Br, I, CN or $NO_2$, or an aromatic or heteroaromatic ring system having 5 to 60 aromatic ring atoms optionally substituted by one or more radicals $R^2$, or an aryloxy or heteroaryloxy group having 5 to 60 aromatic ring atoms, optionally substituted by one or more radicals $R^2$, or a combination of these systems; and wherein two or more adjacent substituents $R^1$ optionally define a mono- or polycyclic, aliphatic or aromatic ring system with one another DCy is, identically or differently on each occurrence, a cyclic group which contains at least one donor atom, carbon in the form of a carbene or phosphorus, via which the cyclic group is bonded to the metal, and which in turn optionally carries one or more substituents $R^1$; the groups DCy and CCy are bonded to one another via a covalent bond;

CCy is, identically or differently on each occurrence, a cyclic group which contains a carbon atom via which the cyclic group is bonded to the metal and which in turn optionally carries one or more substituents $R^1$;

A is, identically or differently on each occurrence, a monoanionic, bidentate chelating ligand.

14. The organic electroluminescent device of claim 1, wherein a matrix material for the phosphorescent compound is selected from the group consisting of compounds of the formula (1):

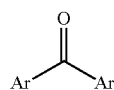

formula (1)

wherein
Ar is on each occurrence, identically or differently, an aromatic or heteroaromatic ring system having 5 to 60 aromatic ring atoms optionally substituted by one or more groups $R^1$;
$R^1$ is on each occurrence, identically or differently, H, D, F, Cl, Br, I, CHO, C(=O)Ar$^1$, P(=O)(Ar$^1$)$_2$, S(=O)Ar$^1$, S(=O)$_2$Ar$^1$, CR$^2$=CR$^2$Ar$^1$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which are optionally substituted by one or more radicals $R^2$, wherein one or more non-adjacent CH$_2$ groups are optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and wherein one or more H atoms are optionally replaced by D, F, Cl, Br, I, CN or NO$_2$, or an aromatic or heteroaromatic ring system having 5 to 60 aromatic ring atoms optionally substituted by one or more radicals $R^2$, or an aryloxy or heteroaryloxy group having 5 to 60 aromatic ring atoms, optionally substituted by one or more radicals $R^2$, or a combination of these systems; and wherein two or more adjacent substituents $R^1$ optionally define a mono- or polycyclic, aliphatic or aromatic ring system with one another;
$Ar^1$ is on each occurrence, identically or differently, an aromatic or heteroaromatic ring system having 5 to 40 aromatic ring atoms optionally substituted by one or more radicals $R^2$;
$R^2$ is on each occurrence, identically or differently, H, D, CN or an aliphatic, aromatic and/or heteroaromatic hydrocarbon radical having 1 to 20 C atoms, in which, in addition, H atoms are optionally replaced by D or F; and wherein two or more adjacent substituents $R^2$ optionally define a mono- or polycyclic, aliphatic or aromatic ring system with one another;
aromatic phosphine oxides, aromatic sulfoxides or sulfones, triarylamines, carbazole derivatives, indolocarbazole derivatives, azacarbazole derivatives, bipolar matrix materials, silanes, azaboroles, boronic esters, triazine derivatives, zinc complexes or diazasilole or tetraazasilole derivatives.

15. The organic electroluminescent device of claim 1, wherein the matrix material for the phosphorescent compound is the same material which is used as electron-conducting material in interlayer 1, which is adjacent to the phosphorescent layer.

16. The organic electroluminescent device of claim 1, wherein the blue-fluorescent dopant in the blue-fluorescent emitter layer is selected from the group consisting of monostyrylamines, distyrylamines, tristyrylamines, tetrastyrylamines, styrylphosphines, styryl ethers and arylamines containing one or more amino groups.

17. The organic electroluminescent device of claim 1, wherein the host material for the blue-fluorescent dopant is selected from the group consisting of oligoarylenes, oligoarylenevinylenes, polypodal metal complexes, hole-conducting compounds, electron-conducting compounds, phosphine oxides or sulfoxides, and boronic acid derivatives.

18. The organic electroluminescent device of claim 1, wherein the hole-conducting material employed in interlayer 2, which is adjacent to the fluorescent emitter layer, is an aromatic amine, and a material which is likewise employed in a hole-injection or hole-transport layer.

19. An organic electroluminescent device comprising at least one blue-fluorescent emitter layer and at least one further emitter layer which is a phosphorescent emitter layer, wherein at least two interlayers 1 and 2 are inserted between the blue-fluorescent emitter layer and the next phosphorescent emitter layer, where interlayer 1 is adjacent to the phosphorescent emitter layer and interlayer 2 is adjacent to the blue-fluorescent emitter layer and wherein a matrix material for the phosphorescent compound is selected from the group consisting of compounds of the formula (1):

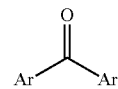

formula (1)

wherein
Ar is on each occurrence, identically or differently, an aromatic or heteroaromatic ring system having 5 to 60 aromatic ring atoms optionally substituted by one or more groups $R^1$;
$R^1$ is on each occurrence, identically or differently, H, D, F, Cl, Br, I, CHO, C(=O)Ar$^1$, P(=O)(Ar$^1$)$_2$, S(=O)Ar$^1$, S(=O)$_2$Ar$^1$, CR$^2$=CR$^2$Ar$^1$, CN, NO$_2$, Si(R$^2$)$_3$, B(OR$^2$)$_2$, B(R$^2$)$_2$, B(N(R$^2$)$_2$)$_2$, OSO$_2$R$^2$, a straight-chain alkyl, alkoxy or thioalkoxy group having 1 to 40 C atoms or a straight-chain alkenyl or alkynyl group having 2 to 40 C atoms or a branched or cyclic alkyl, alkenyl, alkynyl, alkoxy or thioalkoxy group having 3 to 40 C atoms, each of which are optionally substituted by one or more radicals $R^2$, wherein one or more non-adjacent CH$_2$ groups are optionally replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and wherein one or more H atoms are optionally replaced by D, F, Cl, Br, I, CN or NO$_2$, or an aromatic or heteroaromatic ring system having 5 to 60 aromatic ring atoms optionally substituted by one or more radicals $R^2$, or an aryloxy or heteroaryloxy group having 5 to 60 aromatic ring atoms, optionally substituted by one or more radicals $R^2$, or a combination of these systems; and wherein two or more adjacent substituents $R^1$ optionally define a mono- or polycyclic, aliphatic or aromatic ring system with one another;
$Ar^1$ is on each occurrence, identically or differently, an aromatic or heteroaromatic ring system having 5 to 40 aromatic ring atoms optionally substituted by one or more radicals $R^2$;
$R^2$ is on each occurrence, identically or differently, H, D, CN or an aliphatic, aromatic and/or heteroaromatic hydrocarbon radical having 1 to 20 C atoms, in which, in addition, H atoms are optionally replaced by D or F; and wherein two or more adjacent substituents $R^2$ optionally define a mono- or polycyclic, aliphatic or aromatic ring system with one another;
aromatic phosphine oxides, aromatic sulfoxides or sulfones, triarylamines, carbazole derivatives, indolocarbazole derivatives, azacarbazole derivatives, bipolar matrix materials, silanes, azaboroles, boronic esters, triazine derivatives, zinc complexes or diazasilole or tetraazasilole derivatives.

* * * * *